(12) United States Patent
Degawa et al.

(10) Patent No.: US 11,165,128 B1
(45) Date of Patent: Nov. 2, 2021

(54) HIGH-FREQUENCY DEVICE

(71) Applicant: TDK CORPORATION, Tokyo (JP)

(72) Inventors: Naomichi Degawa, Tokyo (JP); Shinji Hara, Tokyo (JP); Akimasa Kaizu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/930,775

(22) Filed: Jul. 16, 2020

(51) Int. Cl.
| | | |
|---|---|---|
| *H01P 1/20* | (2006.01) | |
| *H03H 1/00* | (2006.01) | |
| *H01P 1/218* | (2006.01) | |

(52) U.S. Cl.
CPC ................... *H01P 1/218* (2013.01)

(58) Field of Classification Search
CPC ........ H01P 1/20; H03H 1/0007; H01F 27/266
USPC .............. 333/202, 12, 182; 336/92
See application file for complete search history.

(56) References Cited

U.S. PATENT DOCUMENTS

| | | | | |
|---|---|---|---|---|
| 6,285,265 | B1 * | 9/2001 | Morita | ...................... H01F 17/06 333/12 |
| 6,816,033 | B2 * | 11/2004 | Richarte | .............. H03H 1/0007 333/182 |
| 2011/0233697 | A1 | 9/2011 | Kajiyama | |
| 2016/0277000 | A1 | 9/2016 | Shibata et al. | |
| 2017/0244377 | A1 | 8/2017 | Yamane et al. | |
| 2018/0277749 | A1 | 9/2018 | Urabe et al. | |
| 2019/0148046 | A1 | 5/2019 | Suzuki | |

FOREIGN PATENT DOCUMENTS

| | | |
|---|---|---|
| JP | 2017-063397 A | 3/2017 |
| WO | 2007/032149 A1 | 3/2007 |
| WO | 2018/052062 A1 | 3/2018 |

OTHER PUBLICATIONS

Konishi et al; "Radio-Frequency Amplification Property of the MgO-based Magnetic Tunnel Junction Using Field-Induced Ferromagnetic Resonance"; Applied Physics Letters; Apr. 2013; vol. 102; pp. 162409-162409-4.

* cited by examiner

*Primary Examiner* — Dean O Takaoka
(74) *Attorney, Agent, or Firm* — Oliff PLC

(57) ABSTRACT

A high-frequency device includes a magnetoresistance effect element which includes a first ferromagnetic layer, a second ferromagnetic layer, and a spacer layer positioned between the first and second ferromagnetic layers, a soft magnetic material body which covers at least a part of a periphery of the magnetoresistance effect element from outside in a plan view in a lamination direction of the magnetoresistance effect element, a non-magnetic material body which is positioned between the soft magnetic material body and the first ferromagnetic layer in the plan view in the lamination direction, and a high-frequency line which is connected to or spaced apart from the magnetoresistance effect element. The high-frequency line is configured to input or output a high-frequency current to or from the magnetoresistance effect element, or is configured to apply a high-frequency magnetic field caused by a high-frequency current flowing through the inside to the magnetoresistance effect element.

11 Claims, 12 Drawing Sheets

HIGH-FREQUENCY DEVICE

BACKGROUND

The disclosure relates to a high-frequency device.

In recent years, as mobile communication terminals such as mobile phones have been made with higher functionality, wireless communication speeds have increased. Since a communication speed is in proportion to a bandwidth of a frequency used, a frequency band required for communication is increasing. In accordance with such an increase, the number of required high-frequency filters installed in mobile communication terminals has also increased.

In recent years, spintronics has been studied as a possible field which can be applied to new high-frequency parts. One phenomenon to which attention has been paid in this field is a ferromagnetic resonance phenomenon due to a magnetoresistance effect element.

If an alternating current or an alternating magnetic field is applied to a ferromagnetic layer included in a magnetoresistance effect element, ferromagnetic resonance can be caused in magnetization of the ferromagnetic layer. If ferromagnetic resonance occurs, the resistance value of the magnetoresistance effect element periodically oscillates at a ferromagnetic resonance frequency. According to the strength of a magnetic field applied to the ferromagnetic layer, the ferromagnetic resonance frequency changes, and the ferromagnetic resonance frequency has a high-frequency band of several to several tens of GHz.

For example, Japanese Unexamined Patent Application, First Publication No. 2017-063397 describes a magnetoresistance effect device that can be used as a high-frequency device such as a high-frequency filter using a ferromagnetic resonance phenomenon.

SUMMARY

A ferromagnetic resonance frequency of a ferromagnetic layer included in a magnetoresistance effect element affects characteristics of a high-frequency device. When the ferromagnetic resonance frequency of a ferromagnetic layer fluctuates, signal characteristics of the high-frequency device are degraded.

It is desirable to provide a high-frequency device having excellent signal characteristics.

A high-frequency device according to a first aspect includes a magnetoresistance effect element which includes a first ferromagnetic layer, a second ferromagnetic layer, and a spacer layer positioned between the first ferromagnetic layer and the second ferromagnetic layer, a soft magnetic material body which covers at least a part of a periphery of the magnetoresistance effect element from outside in a plan view in a lamination direction of the magnetoresistance effect element, a non-magnetic material body which is positioned between the soft magnetic material body and the first ferromagnetic layer in the plan view in the lamination direction, and a high-frequency line which is connected to or spaced apart from the magnetoresistance effect element, in which the high-frequency line is configured to input or output a high-frequency current to or from the magnetoresistance effect element; or is configured to apply a high-frequency magnetic field caused by a high-frequency current flowing through an inside of the high-frequency line to the magnetoresistance effect element.

DETAILED DESCRIPTION

Figure 1:
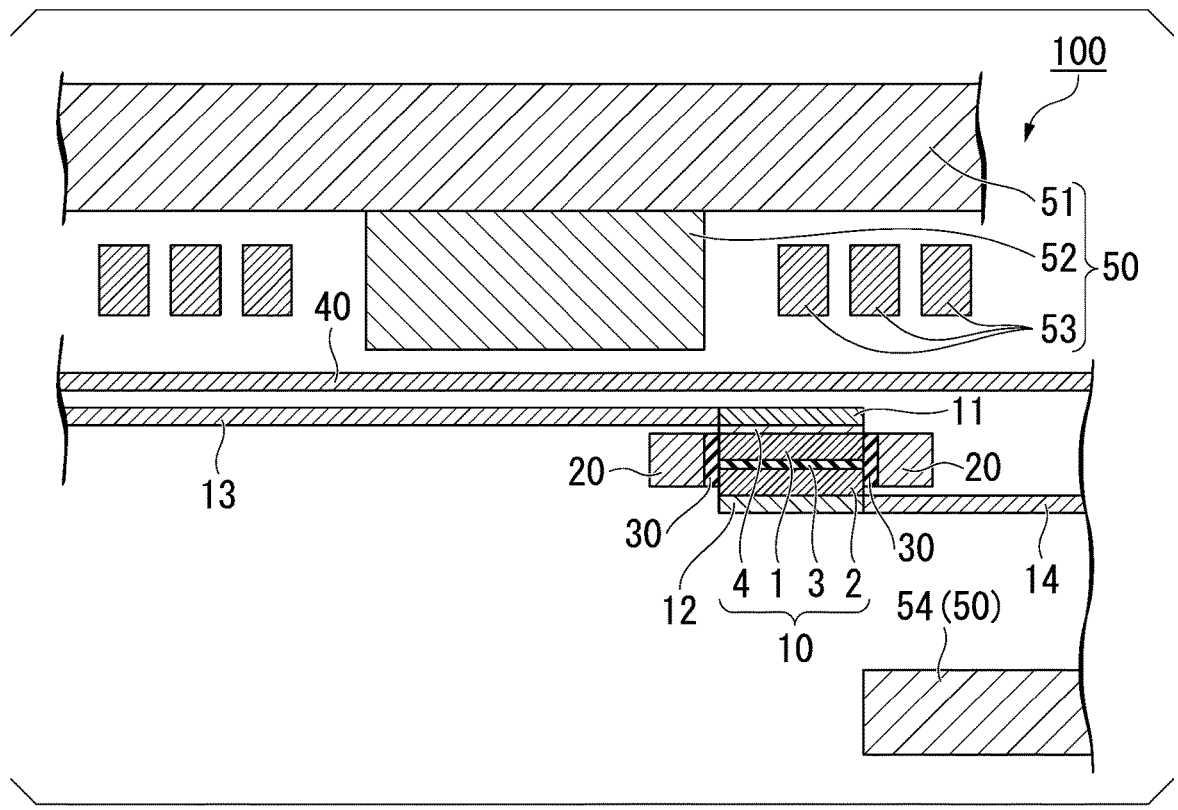
FIG. 1 is a schematic view which shows a circuit configuration of a high-frequency device according to a first embodiment.

Hereinafter, a high-frequency device will be described in detail with reference to the drawings as appropriate. In the drawings used in the following description, feature parts may be shown in an enlarged manner so that the features can be better understood, and dimensional ratios and the like of respective components may be different from actual ones, for convenience. Materials, dimensions, and the like provided in the following description are merely exemplary examples, and the disclosure is not limited thereto, but can be appropriately changed and implemented in the scope of the effects of the disclosure.

First Embodiment

FIG. 1 is a cross-sectional schematic view of a high-frequency device 100 according to a first embodiment. The high-frequency device 100 shown in FIG. 1 includes a magnetoresistance effect element 10, a soft magnetic material body 20, a non-magnetic material body 30, a high-frequency line 40, and a magnetic field application unit 50. The high-frequency device 100 is configured to apply a high-frequency magnetic field caused by a high-frequency current flowing inside the high-frequency line 40 to the magnetoresistance effect element 10. The high-frequency device 100 shown in FIG. 1 is configured to apply a high-frequency magnetic field generated by a high-frequency current flowing inside the high-frequency line 40 to the magnetoresistance effect element 10.

<Magnetoresistance Effect Element>

The magnetoresistance effect element 10 includes a first ferromagnetic layer 1, a second ferromagnetic layer 2, and a spacer layer 3. The spacer layer 3 is positioned between the first ferromagnetic layer 1 and the second ferromagnetic layer 2. In the magnetoresistance effect element 10 shown in FIG. 1, a cap layer 4 is provided on a surface of the first ferromagnetic layer 1 which is an opposite side to the spacer layer 3. Hereinafter, a direction in which respective layers of the magnetoresistance effect element 10 are laminated is referred to as a lamination direction, and a direction perpendicular to the lamination direction is referred to as an in-plane direction.

The first ferromagnetic layer 1 is a magnetization-free layer (a first magnetization-free layer). The second ferromagnetic layer 2 is a magnetization-fixed layer or a magnetization-free layer (a second magnetization-free layer). A magnetization-free layer is a layer made of a magnetic material in which an orientation of magnetization changes when a predetermined external force is applied, and a magnetization-fixed layer is a layer made of a magnetic material in which the orientation of magnetization is less likely to change than the magnetization-free layer when a predetermined external force is applied. The predetermined external force is, for example, an external force applied to magnetization by an external magnetic field, or an external force applied to magnetization by a spin polarization current. For example, the coercivity of a magnetization-fixed layer is larger than the coercivity of a magnetization-free layer. In the magnetoresistance effect element 10, a resistance value of the lamination direction changes in accordance with a change in relative angle between an orientation of magnetization of the first ferromagnetic layer 1 and an orientation of magnetization of the second ferromagnetic layer 2. If the relative angle of the orientation of the magnetization of the first ferromagnetic layer 1 with respect to the orientation of the magnetization of the second ferromagnetic layer 2 changes, the second ferromagnetic layer 2 may be a magnetization-fixed layer or a magnetization-free layer.

The first ferromagnetic layer 1 and the second ferromagnetic layer 2 contain ferromagnetic materials. For example, the first ferromagnetic layer 1 and the second ferromagnetic layer 2 can be made using a metal such as Cr, Mn, Co, Fe, or Ni, or an alloy containing one or more of these metals as a constituent material. In addition, an alloy of the metals described above and at least one or more elements selected from B, C, and N may also be used. For example, when the first ferromagnetic layer 1 and the second ferromagnetic layer 2 function as magnetization-free layers, they may have a CoFeB alloy as a main component. Each of the first ferromagnetic layer 1 and the second ferromagnetic layer 2 may be formed of a plurality of layers.

In addition, the first ferromagnetic layer 1 and the second ferromagnetic layer 2 may be an intermetallic compound (Heusler alloy) represented by a chemical composition of $X_2YZ$. X is a transition metal element or noble metal element of the group of Co, Fe, Ni, or Cu on the periodic table. Y is an element represented by X or a transition metal of the group of Mn, V, Cr, or Ti. Z is a typical element of Group III to Group V. For example, $Co_2FeSi$, $Co_2MnSi$, $Co_2Mn_{1-a}Fe_aAl_bSi_{1-b}$, and the like are known as Heusler alloys.

The first ferromagnetic layer 1 and the second ferromagnetic layer 2 may be perpendicular magnetization films that have an axis of easy magnetization in the lamination direction, and may also be in-plane magnetization films that have an axis of easy magnetization in the in-plane direction.

In order to set a ferromagnetic layer as a perpendicular magnetization film, a layer containing a material that easily brings interfacial magnetic anisotropy is brought into contact with the ferromagnetic layer and annealed. The interfacial magnetic anisotropy is caused to appear on an interface of the ferromagnetic layer by the annealing, and an axis of easy magnetization of the ferromagnetic layer becomes a lamination direction. Examples of the material that easily brings interfacial magnetic anisotropy include, for example, MgO, W, Ta, Mo, and the like. The cap layer 4 is made of the material that easily brings interfacial magnetic anisotropy to set the first ferromagnetic layer 1 as a perpendicular magnetization film. In order to set the second ferromagnetic layer 2 as a perpendicular magnetization film, a buffer layer including the material that easily brings interfacial magnetic anisotropy is provided on a surface of a side opposite to the spacer layer 3.

A layer in contact with the ferromagnetic layer is made of a material that hardly brings interfacial magnetic anisotropy to set the ferromagnetic layer as an in-plane magnetization film. Examples of the material that hardly brings interfacial magnetic anisotropy include, for example, Ru, Cu, and the like. The cap layer 4 is made using the material that hardly brings interfacial magnetic anisotropy to set the first ferromagnetic layer 1 as an in-plane magnetization film. In order to set the second ferromagnetic layer 2 as an in-plane magnetization film, a buffer layer containing the material that hardly brings interfacial magnetic anisotropy is provided on the surface of the side opposite to the spacer layer 3.

When the second ferromagnetic layer 2 functions as a magnetization-fixed layer, an anti-ferromagnetic layer may be added to be in contact with the second ferromagnetic layer 2. In addition, the magnetization of the second ferromagnetic layer 2 may be fixed using magnetic anisotropy caused by a crystal structure, a shape, and the like. The anti-ferromagnetic layer can be made using FeO, CoO, NiO, $CuFeS_2$, IrMn, FeMn, PtMn, Cr, Mn, or the like.

The spacer layer 3 is a non-magnetic layer disposed between the first ferromagnetic layer 1 and the second ferromagnetic layer 2. The spacer layer 3 is configured from a layer configured using a conductor, an insulator, or a semiconductor, or a layer including a conductive point configured using a conductor in the insulator.

For example, when the spacer layer 3 is made of an insulator, the magnetoresistance effect element 10 is a tunnel magnetoresistance (TMR) effect element, and when the spacer layer 3 is made of a metal, the magnetoresistance effect element 10 is a giant magnetoresistance (GMR) effect element.

When the spacer layer 3 is made of a non-magnetic conductive material, it is possible to use a conductive material such as Cu, Ag, Au, or Ru. The film thickness of the spacer layer 3 may be about 0.5 to 3.0 nm to efficiently use the GMR effect.

When the spacer layer 3 is made of a non-magnetic semiconductor material, it is possible to use a material such as ZnO, $In_2O_3$, $SnO_2$, ITO, $GaO_x$, $Ga_2O_x$, or the like. In this case, the film thickness of the spacer layer 3 may be about 1.0 to 4.0 nm.

When a layer including a conductive point configured using a conductor in a non-magnetic insulator is applied as the spacer layer 3, it may have a structure including a conductive point configured using a conductor such as CoFe, CoFeB, CoFeSi, CoMnGe, CoMnSi, CoMnAl, Fe, Co, Au, Cu, Al, or Mg in the non-magnetic insulator which is configured using $Al_2O_3$ or MgO. In this case, the film thickness of the spacer layer 3 may be about 0.5 to 2.0 nm.

In order to increase conductivity of the magnetoresistance effect element 10, electrodes may be provided on both surfaces of the magnetoresistance effect element 10 in the lamination direction. Hereinafter, an electrode provided on an upper part of the magnetoresistance effect element 10 in the lamination direction is referred to as an upper electrode 11, and an electrode provided on a lower part thereof is referred to as a lower electrode 12. The upper electrode 11 and the lower electrode 12 are provided, and thereby contact between a first line 13 and a second line 14 and the magnetoresistance effect element 10 is made on a surface, and a signal (current) flow is along the lamination direction at any position of the magnetoresistance effect element 10 in the in-plane direction.

The upper electrode 11 and the lower electrode 12 are made of a material having conductivity. For example, the upper electrode 11 and the lower electrode 12 can be made using Ta, Cu, Au, AuCu, Ru, Al, and the like.

In addition, the cap layer 4, a seed layer, or a buffer layer may also be arranged or provided between the magnetoresistance effect element 10 and the upper electrode 11 or the lower electrode 12. Examples of the cap layer 4, the seed layer, or the buffer layer include MgO, W, Ta, Mo, Ru, Ta, Cu, Cr, a lamination film of these, or the like. FIG. 1 shows an example in which the cap layer 4 is provided. The film thicknesses of these layers may be each about 2 to 10 nm.

When a plan view shape of the magnetoresistance effect element 10 is a rectangle (including a square), a long side in a size of the magnetoresistance effect element 10 is desirably set to 300 nm or less. When the plan view shape of the magnetoresistance effect element 10 is not a rectangle, a long side of a rectangle circumscribed about the plan view shape of the magnetoresistance effect element 10 in a minimum area is defined as the long side of the magnetoresistance effect element 10.

When the long side is as small as about 300 nm, a volume of the first ferromagnetic layer 1 decreases, and a ferromagnetic resonance phenomenon with high efficiency can be realized. Here, the "plan view shape" is a shape when viewed in the lamination direction of the layers constituting the magnetoresistance effect element 10.

<Soft Magnetic Material Body>

Figure 2:
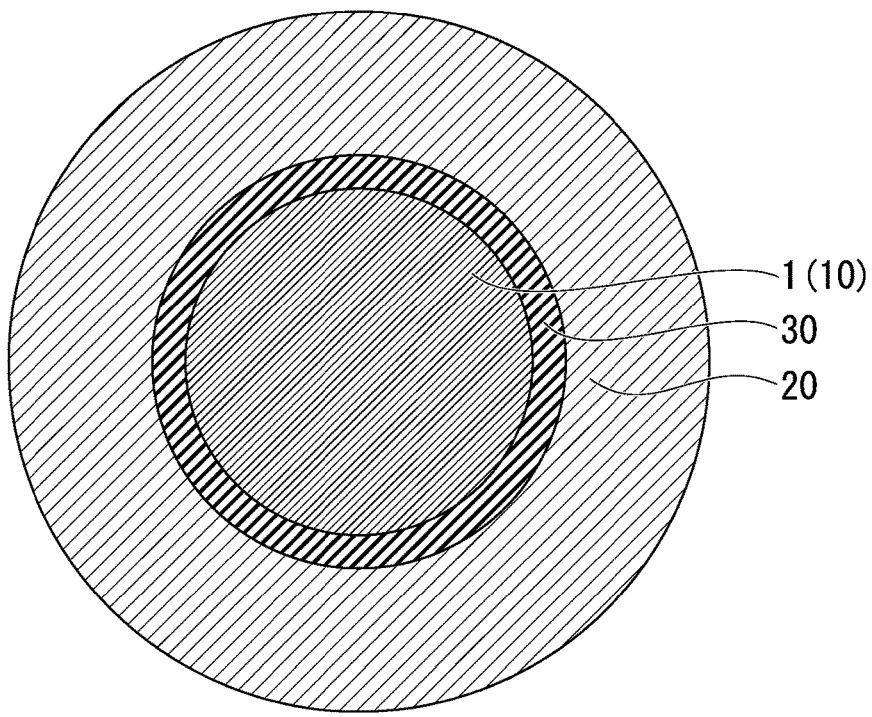
FIG. 2 is a view in which a vicinity of a magnetoresistance effect element of the high-frequency device of the first embodiment is viewed in a planar manner in a lamination direction.

FIG. 2 is a view in which a vicinity of the magnetoresistance effect element 10 of the high-frequency device 100 of the first embodiment is viewed in a planar manner in a lamination direction. A soft magnetic material body 20 shown in FIG. 2 encloses a periphery of the magnetoresistance effect element 10 in a plan view in the lamination direction. A width of the soft magnetic material body 20 in a plan view in the lamination direction may be larger than a thickness of the soft magnetic material body 20 in the lamination direction.

If the soft magnetic material body 20 encloses the periphery of the magnetoresistance effect element 10, variance in strength distribution within the first ferromagnetic layer 1 of an effective magnetic field applied to the first ferromagnetic layer 1 is reduced. The effective magnetic field is a magnetic field that is effectively added to the first ferromagnetic layer 1. The reason for the reduction in variance will be specifically described in the following description. First, with respect to an in-plane direction component of the effective magnetic field applied to the first ferromagnetic layer 1, a reason why the variance in strength distribution within the first ferromagnetic layer 1 is reduced will be described.

Figure 3:
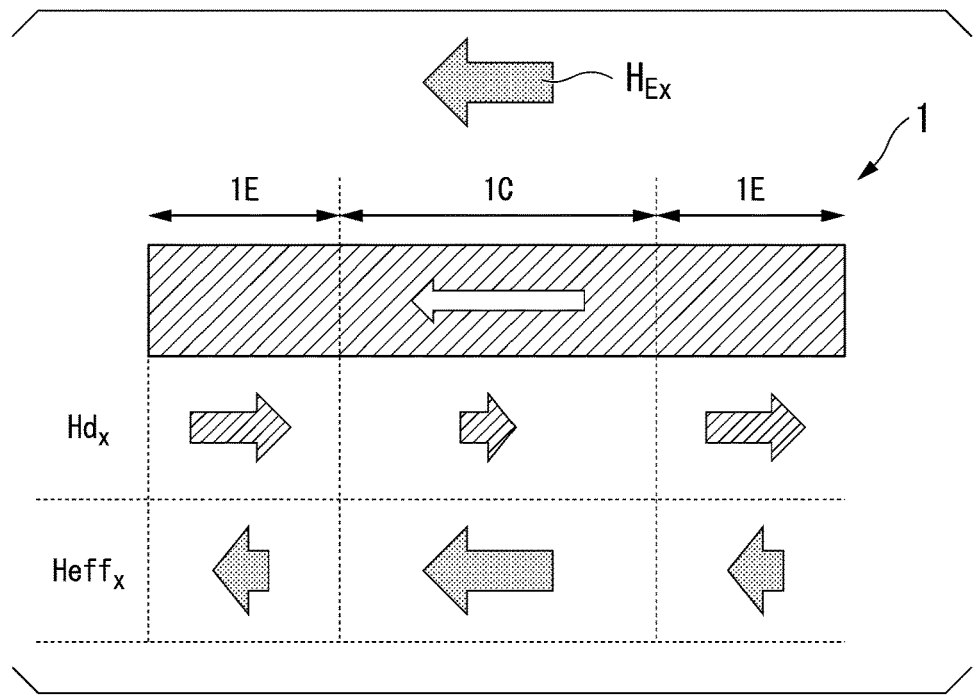
FIG. 3 is a view which schematically shows a relationship between a demagnetizing field and an effective magnetic field when an external magnetic field is applied to a first ferromagnetic layer having no soft magnetic material body.

FIG. 3 is a view which schematically shows a relationship between components of an external magnetic field, a demagnetizing field, and an effective magnetic field, which are applied to the first ferromagnetic layer 1, in the in-plane direction when the first ferromagnetic layer does not have the soft magnetic material body 20. In FIG. 3, the first ferromagnetic layer 1 is shown to be schematically divided into a central area 1C and an end area 1E to facilitate understanding. In FIG. 3, an arrow in the first ferromagnetic layer 1 represents an orientation of magnetization of an in-plane direction component, orientations of the other arrows indicate directions of magnetic fields, and the lengths of the arrows indicate the strengths of the magnetic fields.

As shown in FIG. 3, when the magnetization of the first ferromagnetic layer 1 has an in-plane direction component, a demagnetizing field $Hd_x$ in the in-plane direction is present inside the first ferromagnetic layer 1, and the strength of the demagnetizing field $Hd_x$ becomes larger in the end area 1E than in the central area 1C. The orientation of the demagnetizing field $Hd_x$ is opposite to that of an in-plane direction component $H_{Ex}$ of the external magnetic field.

The strength of an in-plane direction component $Heff_x$ of the effective magnetic field applied to the first ferromagnetic layer 1 is affected not only by the strength of the external magnetic field $H_{Ex}$ but also by the strength of the demagnetizing field $Hd_x$. When the strength of the demagnetizing field $Hd_x$ in the central area 1C and the end area 1E is non-uniform, the strength of the effective magnetic field $Heff_x$ is also non-uniform in the in-plane direction. In this case, the strength of the effective magnetic field $Heff_x$ becomes larger in the central area 1C than in the end area 1E.

Figure 4:
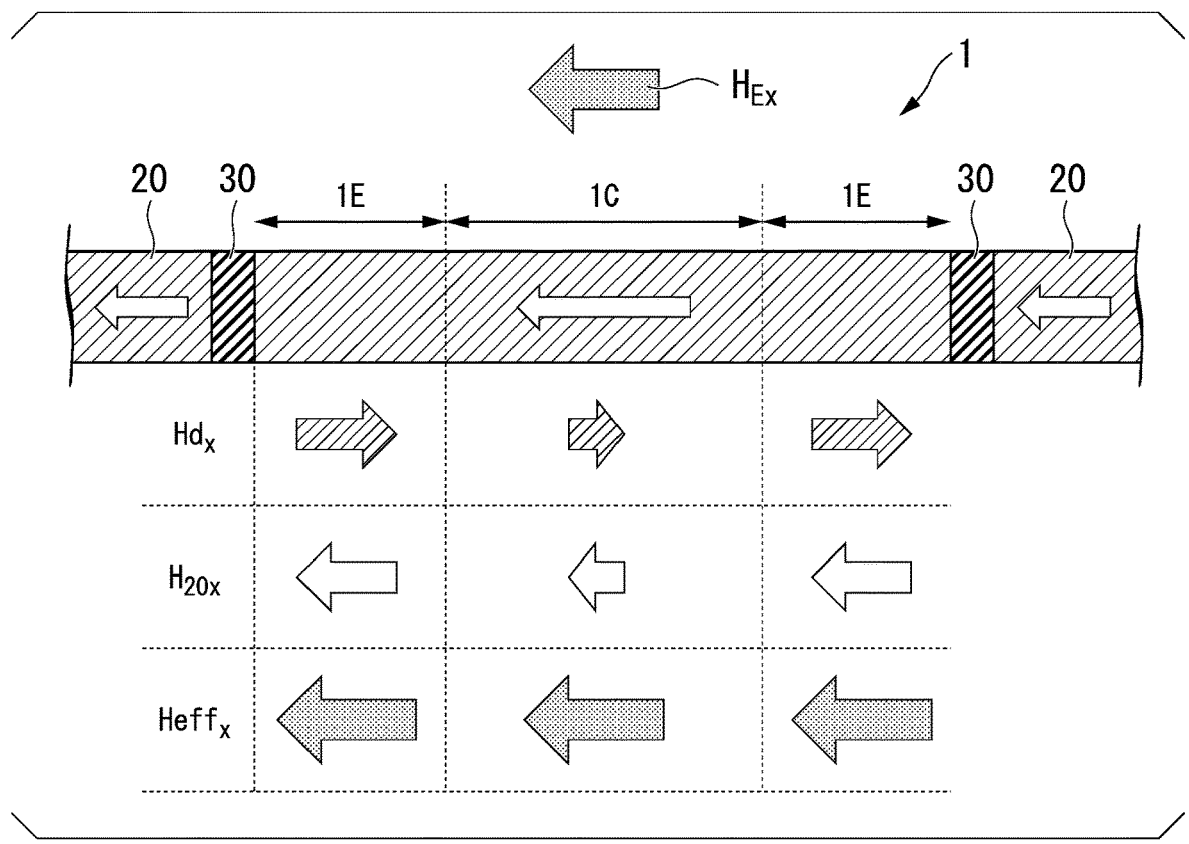
FIG. 4 is a view which schematically shows the relationship between a demagnetizing field and an effective magnetic field when an external magnetic field is applied to a first ferromagnetic layer in a case in which a soft magnetic material body encloses a periphery of the first ferromagnetic layer.

On the other hand, FIG. 4 is a view which schematically shows the relationship among an external magnetic field, a demagnetizing field, and an effective magnetic field which are applied to the first ferromagnetic layer 1 when the soft magnetic material body 20 encloses the periphery of the first ferromagnetic layer 1. In FIG. 4, the first ferromagnetic layer 1 is also shown to be schematically divided into the central area 1C and the end area 1E to facilitate understanding. In FIG. 4, arrows in the first ferromagnetic layer 1 and in the soft magnetic material 20 represent the orientations of the magnetization of in-plane direction components, the orientations of the other arrows indicate the directions of magnetic fields, and the lengths of the arrows indicate the strengths of the magnetic fields.

In FIG. 4, the relationship of the demagnetizing field $Hd_x$ generated in the first ferromagnetic layer 1 is not changed from FIG. 3. The strength of the demagnetizing field $Hd_x$ becomes larger in the end area 1E than in the central area 1C.

If the in-plane direction component $H_{Ex}$ of the external magnetic field is applied to the soft magnetic material body 20, magnetization of the soft magnetic material body 20 also has a component of the in-plane direction. A magnetic field $H_{20x}$ generated by the in-plane direction component of the magnetization of the soft magnetic material body 20 is applied to the first ferromagnetic layer 1. The strength of the magnetic field $H_{20x}$ decreases as it is farther apart from the soft magnetic material body 20. The strength of the magnetic field $H_{20x}$ becomes larger in the end area 1E than in the central area 1C.

A direction of the demagnetizing field $Hd_x$ is opposite to a direction of the magnetic field $H_{20x}$. That is, the magnetic field $H_{20x}$ is added in a direction in which it cancels out the demagnetizing field $Hd_x$. The strength of the effective magnetic field $Heff_x$ is made uniform in a plane of the first ferromagnetic layer 1 such that the magnetic field $H_{20x}$ alleviates an influence of variance of the demagnetizing field $Hd_x$.

When the demagnetizing field $Hd_x$ and the magnetic field $H_{20x}$ completely cancel each other out, the strength of the effective magnetic field $Heff_x$ is made most uniform in the plane of the first ferromagnetic layer 1.

In FIGS. 3 and 4, the reason why variance in strength distribution within the first ferromagnetic layer 1 is reduced with respect to an in-plane direction component of the effective magnetic field applied to the first ferromagnetic layer 1 has been described. Next, the reason why variance in strength distribution within the first ferromagnetic layer 1 is reduced with respect to a lamination direction component of the effective magnetic field applied to the first ferromagnetic layer 1 will be described.

Figure 5:
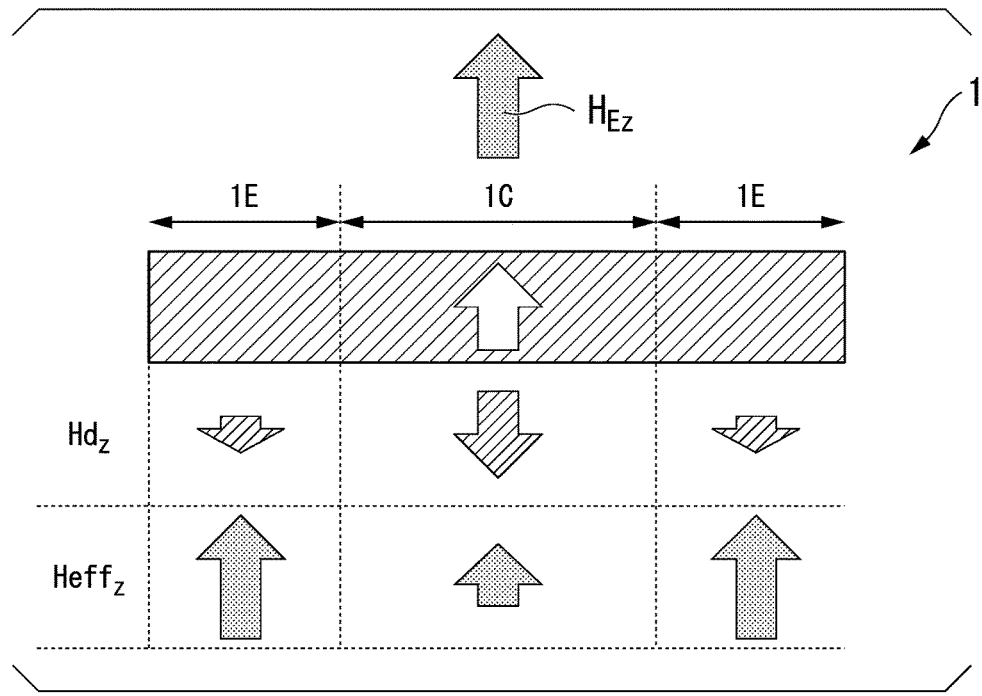
FIG. 5 is a view which schematically shows the relationship between a demagnetizing field and an effective magnetic field when an external magnetic field is applied to the first ferromagnetic layer having no soft magnetic material body.

FIG. 5 is a view which schematically shows the relationship between lamination direction components of an external magnetic field, a demagnetizing field, and an effective magnetic field, which are applied to the first ferromagnetic layer 1 when the first ferromagnetic layer does not have the soft magnetic material body 20. In FIG. 5, the first ferromagnetic layer 1 is shown to be schematically divided into the central area 1C and the end area 1E to facilitate understanding. In FIG. 5, an arrow in the first ferromagnetic layer 1 represents the orientation of a lamination direction component of magnetization, the orientations of the other arrows indicate the directions of magnetic fields, and the lengths of the arrows indicate the strengths of the magnetic fields.

As shown in FIG. 5, when the magnetization of the first ferromagnetic layer 1 has a lamination direction component, a demagnetizing field $Hd_z$ of the lamination direction is present inside the first ferromagnetic layer 1, and the strength of the demagnetizing field $Hd_z$ is smaller in the end area 1E than in the central area 1C. The orientation of the demagnetizing field $Hd_z$ is opposite to that of the lamination direction component $H_{Ez}$ of the external magnetic field.

The strength of the lamination direction component $Heff_z$ of the effective magnetic field added to the first ferromagnetic layer 1 is affected by not only the strength of the external magnetic field $H_{Ez}$ but also by the strength of the demagnetizing field $Hd_z$. When the strengths of the demagnetizing field $Hd_z$ in the central area 1C and the end area 1E are non-uniform, the strength of the effective magnetic field $Heff_z$ in the in-plane direction is also non-uniform. In this case, the strength of the effective magnetic field $Heff_z$ is smaller in the central area 1C than in the end area 1E.

Figure 6:
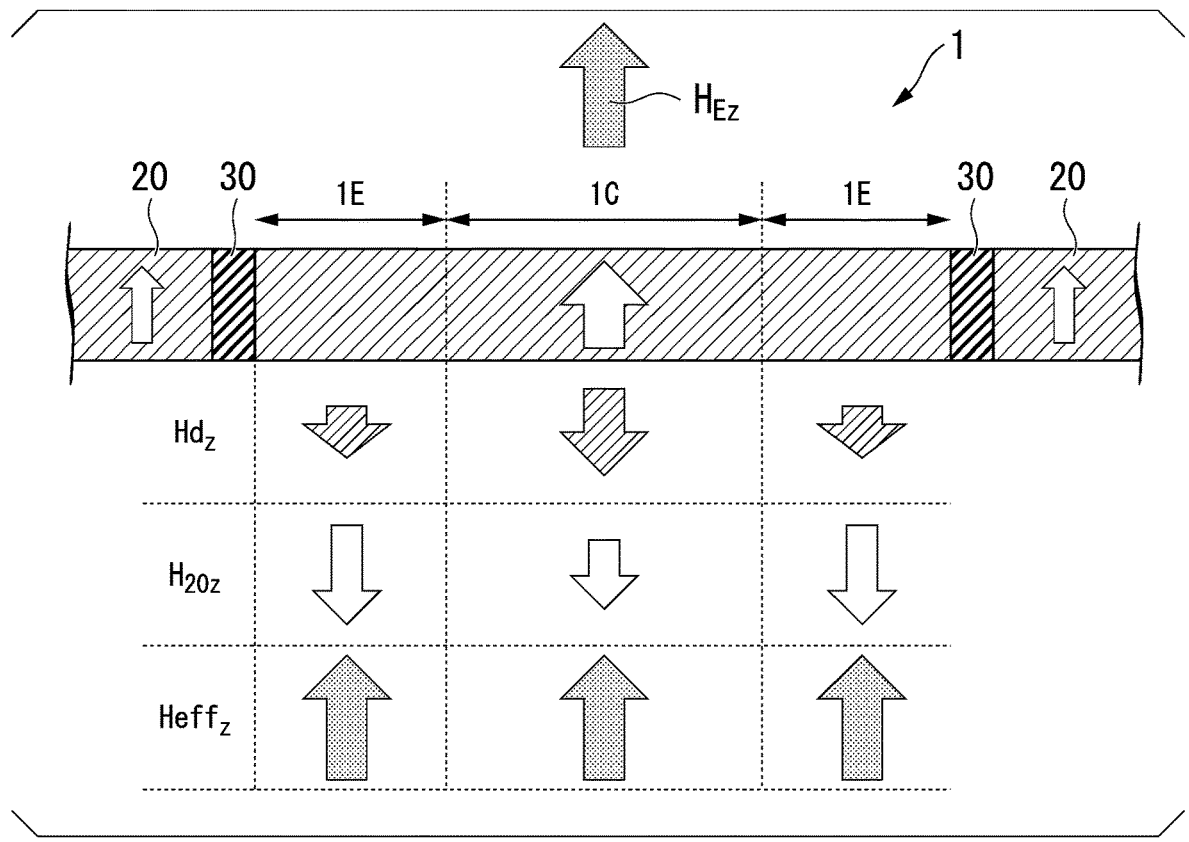
FIG. 6 is a view which schematically shows the relationship between a demagnetizing field and an effective magnetic field when an external magnetic field is applied to the first ferromagnetic layer in a case in which a soft magnetic material body encloses the periphery of the first ferromagnetic layer.

In contrast, FIG. 6 is a view which schematically shows the relationship between an external magnetic field, a demagnetizing field, and an effective magnetic field, which are applied to the first ferromagnetic layer 1, in a case in which the soft magnetic material body 20 encloses the periphery of the first ferromagnetic layer 1. In FIG. 6, the first ferromagnetic layer 1 is shown to be schematically divided into the central area 1C and the end area 1E to facilitate understanding. In FIG. 6, arrows in the first ferromagnetic layer 1 and the soft magnetic material body 20 represent the orientations of lamination direction components of magnetization, the orientations of the other arrows indicate the directions of magnetic fields, and the lengths of the arrows indicate the strength of the magnetic fields.

Even in FIG. 6, the relationship of the demagnetizing field $Hd_z$ generated in the first ferromagnetic layer 1 is not changed from FIG. 5. The strength of the demagnetizing field $Hd_z$ is smaller in the end area 1E than in the central area 1C.

If the lamination direction component $H_{Ez}$ of the external magnetic field is applied to the soft magnetic material body 20, the magnetization of the soft magnetic material body 20 also has a component in the lamination direction. The magnetic field $H_{20z}$ generated by the lamination direction component of the magnetization of the soft magnetic material body 20 is applied to the first ferromagnetic layer 1. The strength of the magnetic field $H_{20z}$ decreases as it is farther apart from the soft magnetic material body 20. The strength of the magnetic field $H_{20z}$ is larger in the end area 1E than in the central area 1C.

A direction of the magnetic field $H_{20z}$ applied to the first ferromagnetic layer 1 is opposite to a direction of the lamination direction component of the magnetization of the soft magnetic material body 20. The direction of the demagnetizing field $Hd_z$ and the direction of the magnetic field $H_{20z}$ are the same. In the end area 1E, the strength of the demagnetizing field $Hd_z$ is small and the strength of the magnetic field $H_{20z}$ is large. In the central area 1C, the strength of the demagnetizing field $Hd_z$ is large and the strength of the magnetic field $H_{20z}$ is small. The strength of the effective magnetic field $Heff_z$ is made uniform in the plane of the first ferromagnetic layer 1 such that the magnetic field $H_{20z}$ alleviates an influence of variance of the demagnetizing field $Hd_z$.

As described above, if the soft magnetic material body 20 encloses the periphery of the magnetoresistance effect element 10, the strengths of the effective magnetic fields $Heff_x$ and $Heff_z$ applied to the first ferromagnetic layer 1 are made uniform in the plane of the first ferromagnetic layer 1. The ferromagnetic resonance frequency of the magnetization of the first ferromagnetic layer 1 is affected by the strengths of the effective magnetic fields $Heff_x$ and $Heff_z$. If the strengths of the effective magnetic fields $Heff_x$ and $Heff_z$ are made uniform in the plane of the first ferromagnetic layer 1, variance of the ferromagnetic resonance frequency generated in the first ferromagnetic layer 1 is suppressed. This leads to an improvement in output characteristics of the high-frequency device 100.

Figure 7:
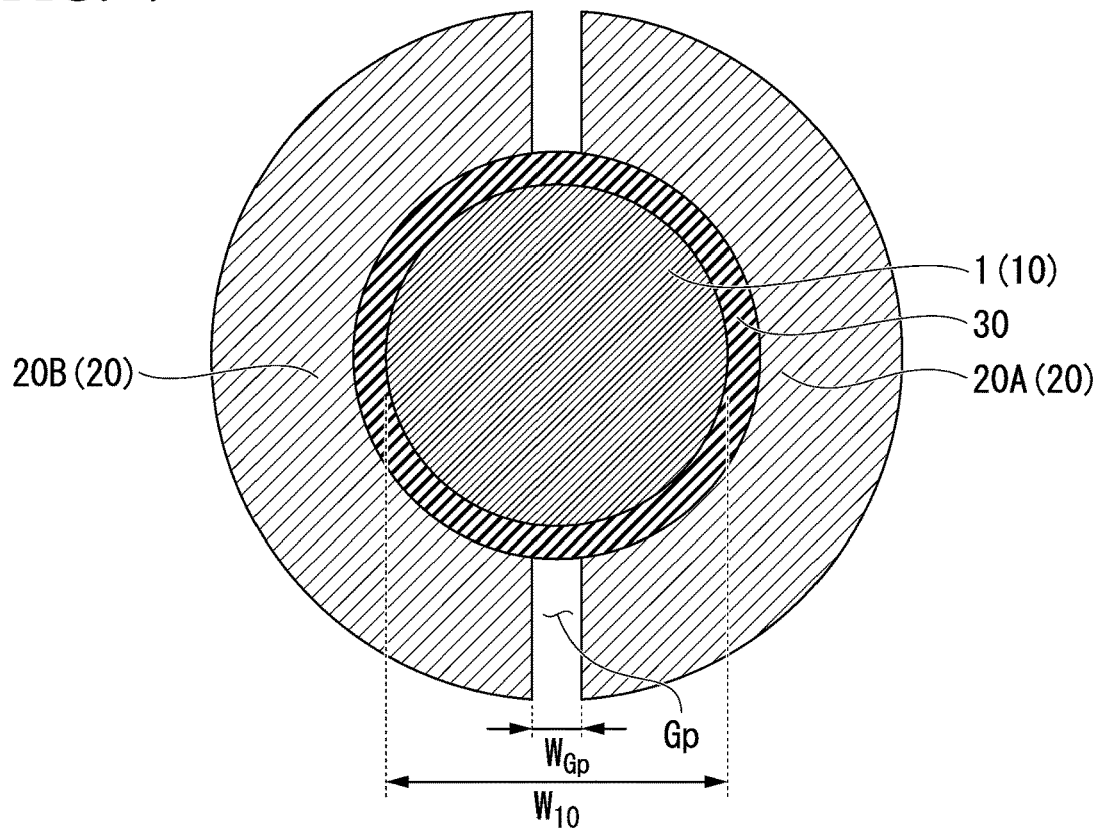
FIG. 7 is a view in which a vicinity of a magnetoresistance effect element as another example of the high-frequency device of the first embodiment is viewed in a planar manner in the lamination direction.

FIG. 7 is a view in which the vicinity of the magnetoresistance effect element 10 as another example of the high-frequency device of the first embodiment is viewed in a planar manner in the lamination direction. The soft magnetic material body 20 is provided to enclose the periphery of the magnetoresistance effect element 10 in the plan view in the lamination direction as shown in FIG. 7, but is different from the soft magnetic material body 20 shown in FIG. 2 in that it does not enclose an entire periphery of the magnetoresistance effect element 10. As shown in FIG. 7, the soft magnetic material body 20 may be configured to cover at least a part of the periphery of the magnetoresistance effect element 10 from outside in the plan view in the lamination direction.

The soft magnetic material body 20 shown in FIG. 7 is divided into a first area 20A and a second area 20B in the plan view in the lamination direction. A gap Gp is formed between the first area 20A and the second area 20B. A width $W_{GP}$ of the gap Gp is narrower than a width $W_{10}$ of the magnetoresistance effect element 10. Here, the width $W_{10}$ of the magnetoresistance effect element 10 means a width of the magnetoresistance effect element 10 in a direction parallel to the width $W_{GP}$ of the gap Gp. The width $W_{GP}$ of the gap Gp may be 60% of the width $W_{10}$ of the magnetoresistance effect element 10.

The gap GP shown in FIG. 7 divides the soft magnetic material body 20 into two parts using two gaps, but one gap may be formed in one soft magnetic material body 20, and three or more gaps may be formed therein. Moreover, for example, the first area 20A and the second area 20B shown in FIG. 7 may be partially connected. Even in a case shown in FIG. 7, the strengths of the effective magnetic fields $Heff_x$ and $Heff_z$ can be made uniform in the plane of the first ferromagnetic layer 1 as compared with a case of not having the soft magnetic material body 20.

The soft magnetic material body 20 may cover 30% or more of the periphery of the magnetoresistance effect element 10 from outside in the plan view in the lamination direction.

The soft magnetic material body 20 shown in FIG. 1 is thicker than the first ferromagnetic layer 1. If a thickness of the soft magnetic material body 20 is thick, a magnetic field generated by the soft magnetic material body 20 increases. An influence of the demagnetizing field inside the first ferromagnetic layer 1 can be further alleviated by increasing the strength of a magnetic field applied from the soft magnetic material body 20 to the end area 1E. As a result, the strength of the effective magnetic field applied to the first ferromagnetic layer 1 can be made more uniform in the plane of the first ferromagnetic layer 1.

In addition, the soft magnetic material body 20 shown in FIGS. 1 and 2 covers the periphery of the first ferromagnetic layer 1 in the lamination direction. That is, an entire periphery of the first ferromagnetic layer 1 in the lamination direction overlaps with the soft magnetic material body 20 when viewed from the in-plane direction which is a direction perpendicular to the lamination direction. Moreover, the high-frequency device shown in FIGS. 1 and 7 has a portion in which the entire periphery of the first ferromagnetic layer 1 in the lamination direction overlaps with the soft magnetic material body 20 when viewed from the in-plane direction which is a direction perpendicular to the lamination direction. In the case of these configurations, the strength of a magnetic field applied from the soft magnetic material body 20 to the end area 1E can increase, and the influence of the demagnetizing field inside the first ferromagnetic layer 1 can be further alleviated.

Figure 8:
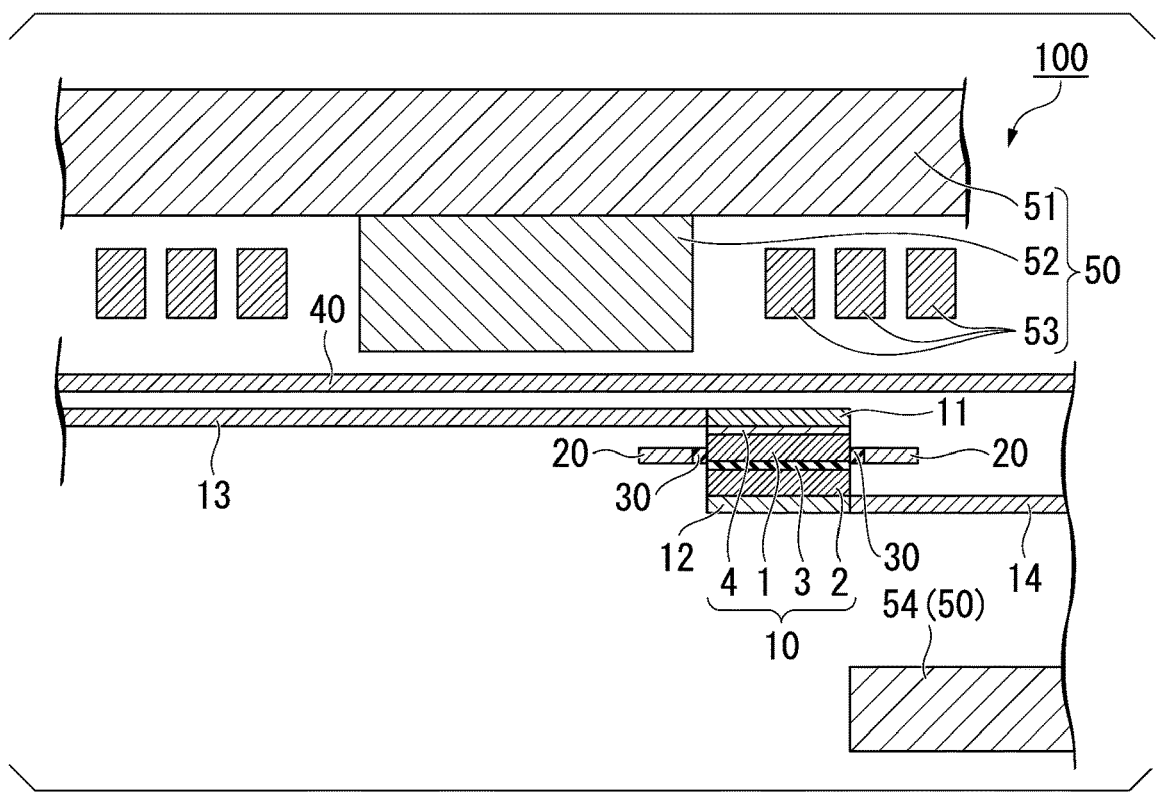
FIG. 8 is a cross-sectional schematic view of the magnetoresistance effect element as another example of the high-frequency device of the first embodiment.

On the other hand, FIG. 8 is a cross-sectional schematic view of another example of the high-frequency device according to the first embodiment.

The soft magnetic material body 20 as shown in FIG. 8 is different from the soft magnetic material body shown in FIG. 1 in that it covers a part of the periphery of the first ferromagnetic layer in the lamination direction, but does not cover an entire surface of the periphery of the first ferromagnetic layer 1 in the lamination direction. As shown in FIG. 8, the soft magnetic material body 20 may have a configuration in which at least a part of the periphery of the first ferromagnetic layer 1 in the lamination direction overlaps with the soft magnetic material body 20 when viewed from the in-plane direction which is a direction perpendicular to the lamination direction. Even in the case shown in FIG. 8, the strength of the effective magnetic field applied to the first ferromagnetic layer 1 can be made more uniform in the plane of the first ferromagnetic layer 1 than in the case of not having the soft magnetic material body 20.

When the first ferromagnetic layer 1 has an axis of easy magnetization in the in-plane direction, a saturation magnetic field of the soft magnetic material body 20 in the lamination direction may be larger than a saturation magnetic field of the first ferromagnetic layer 1 in the lamination direction. If the saturation magnetic field of the soft magnetic material body 20 in the lamination direction is large, a large amount of energy is required to orient the magnetization of the soft magnetic material body 20 in the lamination direction. In other words, the magnetization of the soft magnetic material body 20 is likely to be oriented in the in-plane direction. When the first ferromagnetic layer 1 has an axis of easy magnetization in the in-plane direction, if the magnetization of the soft magnetic material body 20 is oriented in the in-plane direction, the magnetic field $H_{20x}$ which is an in-plane direction component of a magnetic field applied from the soft magnetic material 20 to the first ferromagnetic layer 1 can be enlarged, and the influence of the demagnetizing field $Hd_x$ in the in-plane direction can be easily alleviated (refer to FIG. 4).

On the other hand, when the first ferromagnetic layer 1 has an axis of easy magnetization in the lamination direction, the saturation magnetic field of the soft magnetic material body 20 in the lamination direction may be smaller than the saturation magnetic field of the first ferromagnetic layer 1 in the lamination direction. If the saturation magnetic field of the soft magnetic material body 20 in the lamination direction is small, the magnetization of the soft magnetic material body 20 can be oriented in the lamination direction with only small amount of energy. In other words, the magnetization of the soft magnetic material body 20 is likely to be oriented in the lamination direction. When the first ferromagnetic layer 1 has an axis of easy magnetization in the lamination direction, if the magnetization of the soft magnetic material body 20 is oriented in the lamination direction, the magnetic field $H_{20z}$ which is a lamination direction component of a magnetic field applied from the soft magnetic material body 20 to the first ferromagnetic layer 1 can be enlarged, and the influence of the demagnetizing field $Hd_z$ in the lamination direction can be easily alleviated (refer to FIG. 6).

The soft magnetic material body 20 can be made using, for example, a metal, an alloy, or the like containing at least one of Fe, Ni, and Co. Among these, the soft magnetic material body 20 may mainly contain a NiFe alloy. The soft magnetic material body 20 may be in-plane magnetization films that have an axis of easy magnetization in the in-plane direction (the direction perpendicular to the lamination direction of the magnetoresistance effect element 10), and may also be perpendicular magnetization films that have an axis of easy magnetization in the lamination direction (the direction perpendicular to the film surface of the soft magnetic material body 20).

<Non-Magnetic Material Body>

The non-magnetic material body 30 is positioned between the soft magnetic material body 20 and the first ferromagnetic layer 1 in the plan view in the lamination direction (refer to FIG. 2). Since the non-magnetic material body 30 separates the soft magnetic material body 20 from the first ferromagnetic layer 1, magnetic domains in the first ferromagnetic layer 1 is suppressed from being generated as compared with a case in which the soft magnetic material body 20 and the first ferromagnetic layer 1 are connected. The variance of the ferromagnetic resonance frequency in the first ferromagnetic layer 1 is suppressed by suppressing the generation of magnetic domains.

A width of the non-magnetic material body 30 in the plan view in the lamination direction may be 10 Å or more and 100 Å or less. If a width of the non-magnetic material body 30 is too narrow, an exchange coupling is generated between the soft magnetic material body 20 and the first ferromagnetic layer. If the width of the non-magnetic material body 30 is too wide, a magnetic field generated from the soft magnetic material body 20 cannot be efficiently applied to the first ferromagnetic layer 1.

The non-magnetic material 30 may be made of an insulating material. For example, oxides such as $Al_2O_3$, $SiO_2$, MgO, ZnO, $In_2O_3$, $SnO_2$, ITO, $GaO_x$, or $Ga_2O_x$ can be used.

<High-Frequency Line>

The high-frequency line 40 is disposed to be connected to or to be spaced apart from the magnetoresistance effect element 10. In the high-frequency device 100 shown in FIG. 1, the high-frequency line 40 is disposed to be spaced apart from the magnetoresistance effect element 10.

In the high-frequency line 40 shown in FIG. 1, the first end is connected to an input source, and the second end is connected to a reference potential. A high-frequency current flows in the high-frequency line 40 in accordance with a potential difference between a reference potential and a high-frequency signal input from the input source.

The high-frequency line 40 shown in FIG. 1 is configured to apply a high-frequency magnetic field caused by a high-frequency current flowing inside to the magnetoresistance effect element 10 (the first ferromagnetic layer 1). The high-frequency magnetic field generated in the high-frequency line 40 is applied to the first ferromagnetic layer 1 of the magnetoresistance effect element 10. The frequency of the high-frequency magnetic field applied to the first ferromagnetic layer 1 largely oscillates in the vicinity of the ferromagnetic resonance frequency of the first ferromagnetic layer 1. This phenomenon is a ferromagnetic resonance phenomenon.

The high-frequency line 40 is not limited to a single signal line, and may be a plurality of signal lines. In this case, a plurality of signal lines may be arranged or provided at positions at which high-frequency magnetic fields generated from respective signal lines strengthen each other at a position of the first ferromagnetic layer 1.

<Magnetic Field Application Unit>

The magnetic field application unit 50 is arranged or provided at a position at which the external magnetic field can be applied to the first ferromagnetic layer 1 and the soft magnetic material body 20. In the example shown in FIG. 1, the magnetic field application unit 50 is disposed at least on a side of the magnetoresistance effect element 10 in the lamination direction. The magnetic field application unit 50 applies a static magnetic field to the first ferromagnetic layer 1 and the soft magnetic material body 20.

The magnetic field application unit 50 sets the ferromagnetic resonance frequency of the first ferromagnetic layer 1 of the magnetoresistance effect element 10. A frequency of a signal output by the high-frequency device 100 varies depending on the ferromagnetic resonance frequency of the first ferromagnetic layer 1. The frequency of the output signal can be set by the magnetic field application unit 50.

The magnetic field application unit 50 may be arranged or provided in the vicinity of the magnetoresistance effect element 10. The magnetic field application unit 50 is configured using of an electromagnetic type or a strip line type magnetic field application mechanism which can variably control an application magnetic field strength according to, for example, one of a voltage or a current. In addition, the magnetic field application unit 50 may also be configured using a combination of an electromagnetic type or a strip line type magnetic field application mechanism capable of variably controlling an application magnetic field strength and a permanent magnet that supplies only a fixed magnetic field.

The magnetic field application unit 50 shown in FIG. 1 includes a base 51, a protrusion 52, and a coil 53. In addition, the magnetic field application unit 50 shown in FIG. 1 includes an opposing portion 54 opposed to the base 51 at a position at which the magnetoresistance effect element 10 is sandwiched. The magnetic field application unit 50 shown in FIG. 1 applies an external magnetic field having both an in-plane direction component and a lamination direction component to the magnetoresistance effect element 10 (the first ferromagnetic layer 1). The protrusion 52 protrudes toward the magnetoresistance effect element 10 from the base 51 in a direction parallel to the lamination direction.

The base 51 and the protrusion 52 may be integrated or separated. In addition, the protrusion 52 may be made in multiple stages.

The base 51, the protrusion 52, and the opposing portion 54 may be a soft magnetic material body or a hard magnetic material body. A soft magnetic material body can be made of a metal, an alloy, or the like containing at least one of Fe, Ni, and Co. The examples include a NiFe alloy, a CoFe alloy, and the like. In the case of a soft magnetic material body, an anti-ferromagnetic material such as IrMn may be magnetically bonded to the soft magnetic material body, and a magnetization direction of the soft magnetic material body may be fixed. On the other hand, a hard magnetic material body can be made of a CoPt alloy, a FePt alloy, and a CoCrPt alloy.

The coil 53 shown in FIG. 1 is a spiral coil spirally wound around the protrusion 52 in a spiral shape. A type of the coil 53 is not limited to the spiral coil, and may have other known configurations. In addition, the coil 53 shown in FIG. 1 is wound around the protrusion 52, but may also be wound around the base 51. The magnitude of the static magnetic field applied to the magnetoresistance effect element 10 can be changed by changing a value of current flowing throughout the coil 53. The coil 53 is not essential and may not be provided. The magnetic field application unit 50 may also be configured using only a coil.

As described above, according to the high-frequency device 100 of the present embodiment, strengths of the effective magnetic fields $Heff_x$ and $Heff_x$ applied to the first ferromagnetic layer 1 can be made uniform within the plane of the first ferromagnetic layer 1. If the strengths of the effective magnetic fields $Heff_x$ and $Heff_x$ are made uniform in the plane of the first ferromagnetic layer 1, the variance of the ferromagnetic resonance frequency generated in the first ferromagnetic layer 1 is suppressed. This leads to an improvement in output characteristics of the high-frequency device 100.

Hereinafter, a specific application example of the high-frequency device 100 will be described.

Application Example 1

Figure 9:
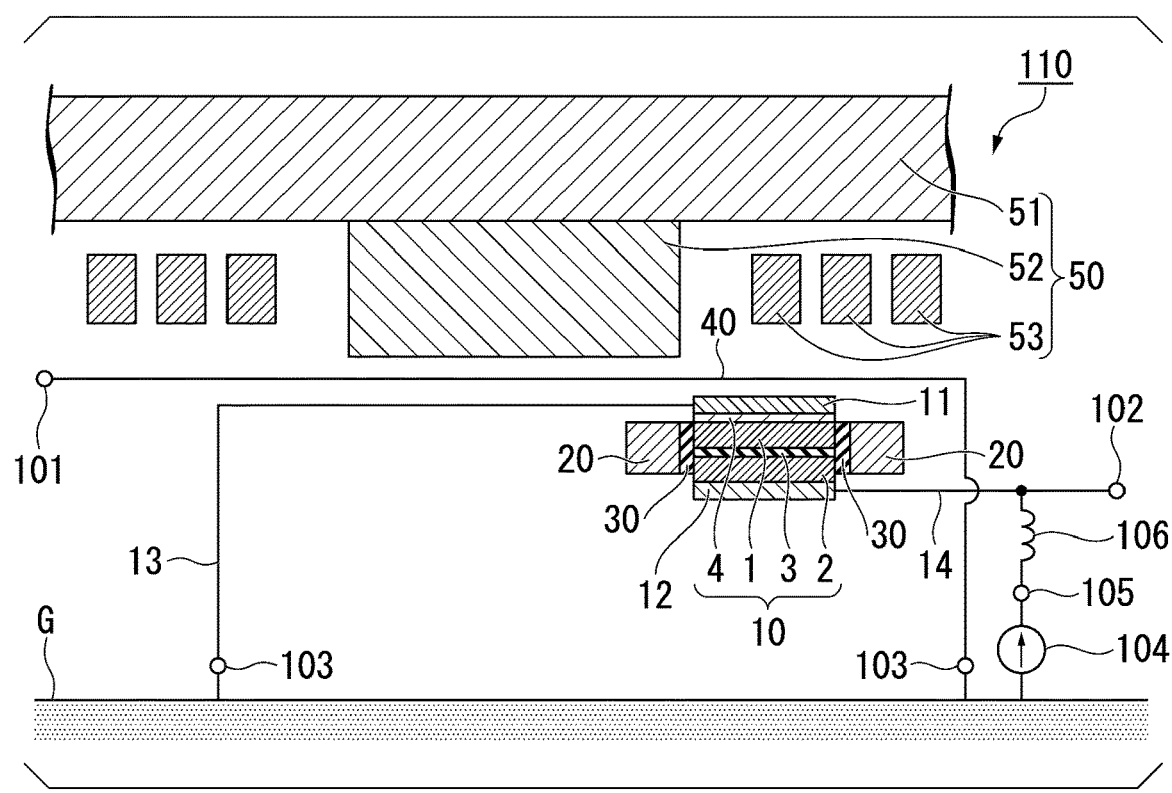
FIG. 9 shows an application example of the high-frequency device of the first embodiment.

FIG. 9 shows an example of a circuit of a high-frequency device 110 to which the high-frequency device 100 of the first embodiment is applied. A high-frequency device 110 shown in FIG. 9 includes the magnetoresistance effect element 10, the soft magnetic material body 20, the non-magnetic material body 30, a high-frequency line 40, and a magnetic field application unit 50. In FIG. 9, the opposing portion 54 of the magnetic field application unit 50 is omitted. These constituents are the same as in the high-frequency device 100 described above. In the high-frequency device 110, a signal is input from a first port 101 and a signal is output from a second port 102. An output signal (a frequency of an output signal) can be changed by the magnetic field application unit 50.

The high-frequency device 110 is a magnetic field-driven high-frequency device. In the magnetic field-driven high-frequency device, the high-frequency line 40 and the magnetoresistance effect element 10 are disposed to be spaced apart from each other. The high-frequency magnetic field caused by the high-frequency current flowing inside the high-frequency line 40 is applied to the magnetoresistance effect element 10, and thereby the high-frequency device 110 functions.

<First Port and Second Port>

The first port 101 is an input terminal of the high-frequency device 110. The first port 101 corresponds to, for example, the first end of the high-frequency line 40. An alternating signal (a high-frequency signal) can be applied to the high-frequency device 110 by connecting an alternating signal source (not shown) to the first port 101. The high-frequency signal applied to the high-frequency device 110 is, for example, a signal having a frequency of 100 MHz or above.

The second port 102 is an output terminal of the high-frequency device 110. The second port 102 corresponds to, for example, a second end of the second line 14.

<High-Frequency Line>

In the high-frequency line 40 shown in FIG. 9, the first end is connected to the first port 101, and the second end is connected to the reference potential terminal 103. The high-frequency line 40 shown in FIG. 9 specifically shows a connection relationship between both ends of the high-frequency line 40 in FIG. 1. The reference potential terminal 103 is a terminal for connecting a reference potential and a line. The high-frequency device 110 is used by the second end of the high-frequency line 40 being connected to the reference potential via the reference potential terminal 103. In FIG. 9, the reference potential is set to a ground G. The ground G may be set to one outside the high-frequency device 110. A high-frequency current flows in the high-frequency line 40 in accordance with a potential difference between the ground G and a high-frequency signal input to the first port 101.

<First Line>

The first line 13 is a line in which the second end is connected to the upper electrode 11. In the first line 13 shown in FIG. 9, the first end is connected to the reference potential terminal 103, and the second end is connected to the upper electrode 11. The first line 13 shown in FIG. 9 specifically shows a connection relationship at a left end of the first line 13 in FIG. 1. The high-frequency device 110 is used by a first end of the first line 13 being connected to the reference potential via the reference potential terminal 103.

<Second Line>

The second line 14 is a line in which the first end is connected to the lower electrode 12. In the second line 14 shown in FIG. 9, the first end is connected to the lower electrode 12, and the second end is connected to the second port 102. The second line 14 shown in FIG. 9 specifically shows a connection relationship at a right end of the second line 14 in FIG. 1.

The second line 14 shown in FIG. 9 transmits a signal output from the magnetoresistance effect element 10.

The signal output from the magnetoresistance effect element 10 is a signal of a frequency selected using the ferromagnetic resonance of the first ferromagnetic layer 1.

Shapes of each line and the ground G may be defined as a micro strip line (MSL) type or coplanar waveguide (CPW) type. When a micro strip line (MSL) type or a coplanar waveguide (CPW) type is designed, a line width or a distance between the line and the ground may be designed such that characteristic impedance of a line becomes equal to impedance of a circuit system. Such a design can minimize a transmission loss of a line.

A reference potential to which each line is connected may be provided individually or in common. The reference potential may be in common to simplify a circuit configuration. In FIG. 9, the high-frequency line 40 and the first line 13 are connected to the same ground G.

<DC Applied Terminal>

A DC applied terminal 105 is connected to a power supply 104, and a DC current or a DC voltage is applied to the magnetoresistance effect element 10 in the lamination direction. A DC current in the present specification is a current whose direction does not change according to time, and includes a current whose magnitude changes according to time. In addition, a DC voltage is a voltage whose polarity does not change according to time, and includes a voltage whose magnitude changes according to time.

The power supply 104 may be a DC current source or a DC voltage source. The power supply 104 may be a DC current source capable of generating a constant DC current or a DC voltage source capable of generating a constant DC voltage. In addition, the power supply 104 may be a DC current source capable of changing the magnitude of a generated DC current value, and may be a DC voltage source capable of changing the magnitude of a generated DC voltage value. The current density of a current applied to the magnetoresistance effect element 10 may be smaller than an oscillation threshold current density of the magnetoresistance effect element 10. The oscillation threshold current density of the magnetoresistance effect element 10 is a current density of a threshold at which the magnetization of the first ferromagnetic layer 1 of the magnetoresistance effect element 10 starts a precession with a constant frequency and a constant amplitude according to a current of the current density of the value or higher being applied, and at which the magnetoresistance effect element 10 oscillates (an output (resistance value) of the magnetoresistance effect element 10 fluctuates with a constant frequency and a constant amplitude).

An inductor 106 is arranged or provided in a portion at which a high-frequency current is to be cut. In FIG. 9, the inductor 106 is arranged or provided between the DC applied terminal 105 and the second line 14. The inductor 106 cuts a high-frequency component of a current and passes an invariant component of a current. An output signal output from the magnetoresistance effect element 10 by the inductor 106 effectively flows to the second port 102. In addition, the invariant component of a current flows through a closed circuit of the power supply 104, the second line 14, the magnetoresistance effect element 10, a first line 31, and a ground G by the inductor 106.

The inductor 106 can be made of a chip inductor, an inductor of a pattern line, a resistance element having an inductor component, or the like. Inductance of the inductor 106 may be 10 nH or more.

<Function of High-Frequency Device>

If a high-frequency signal is input to the high-frequency device 110 from the first port 101, a high-frequency current which corresponds to the high-frequency signal flows in the high-frequency line 40. A high-frequency magnetic field generated by the high-frequency current flowing in the high-frequency line 40 is applied to the first ferromagnetic layer 1 of the magnetoresistance effect element 10.

In the magnetization of the first ferromagnetic layer 1, a frequency of the high-frequency magnetic field applied to the magnetoresistance effect element 10 by the high-frequency line 40 largely oscillates in the vicinity of the ferromagnetic resonance frequency of the first ferromagnetic layer 1.

As oscillation of the magnetization of the first ferromagnetic layer 1 becomes larger, a change in resistance value in the magnetoresistance effect element 10 becomes larger. For example, when a constant DC current is applied from the DC applied terminal 105 to the magnetoresistance effect element 10, the change in resistance value of the magnetoresistance effect element 10 is output from the second port 102 as a change in potential difference between the upper electrode 11 and the lower electrode 12. In addition, for example, when a constant DC voltage is applied from the DC applied terminal 105 to the magnetoresistance effect element 10, the change in resistance value of the magnetoresistance effect element 10 is output from the second port 102 as a change in current value flowing between the upper electrode 11 and the lower electrode 12. That is, a signal caused by the oscillation of the magnetization of the first ferromagnetic layer 1 is output from the second port 102.

That is, when a frequency of a high-frequency signal input from the first port 101 is in the vicinity of the ferromagnetic resonance frequency of the first ferromagnetic layer 1, a variance amount of the resistance value of the magnetoresistance effect element 10 is large, and a large signal is output from the second port 102. On the other hand, when the frequency of a high-frequency signal deviates from the ferromagnetic resonance frequency of the first ferromagnetic layer 1, the variance amount of the resistance value of the magnetoresistance effect element 10 is small, and a signal from the second port 102 is hardly output. That is, the high-frequency device 110 functions as a high-frequency filter which can selectively cause a high-frequency signal of a specific frequency to pass.

Moreover, an axis of easy magnetization of the first ferromagnetic layer 1 may have a component in a film surface normal direction, and the second ferromagnetic layer 2 may have an axis of easy magnetization in a film surface direction to increase a range of cutoff characteristics and pass characteristics as a high-frequency filter.

Other Applications

In addition, a case in which the high-frequency device 110 is used as a high-frequency filter has been exemplified in the above description, but the high-frequency device 110 can also be used as a high-frequency device such as an isolator, a phase shifter, an amplifier, or the like.

When the high-frequency device 110 is used as an isolator, a signal from the second port 102 is input. Since the signal input from the second port 102 is not output from the first port 101, the high-frequency device functions as an isolator.

In addition, when the high-frequency device 110 is used as a phase shifter, in a case in which an output frequency band changes, a frequency of an arbitrary point of the output frequency band is focused. When the output frequency band changes, since a phase at a specific frequency changes, the high-frequency device 110 functions as a phase shifter.

Moreover, when the high-frequency device 110 is used as an amplifier, a Dc current or a DC voltage applied from the power supply 104 is set to a predetermined magnitude or larger. In this manner, a signal output from the second port 102 is larger than a signal input from the first port 101, and the high-frequency device 110 functions as an amplifier.

As described above, the high-frequency device 110 functions as a high-frequency filter, an isolator, a phase shifter, an amplifier, or the like.

Application Example 2

Figure 10:
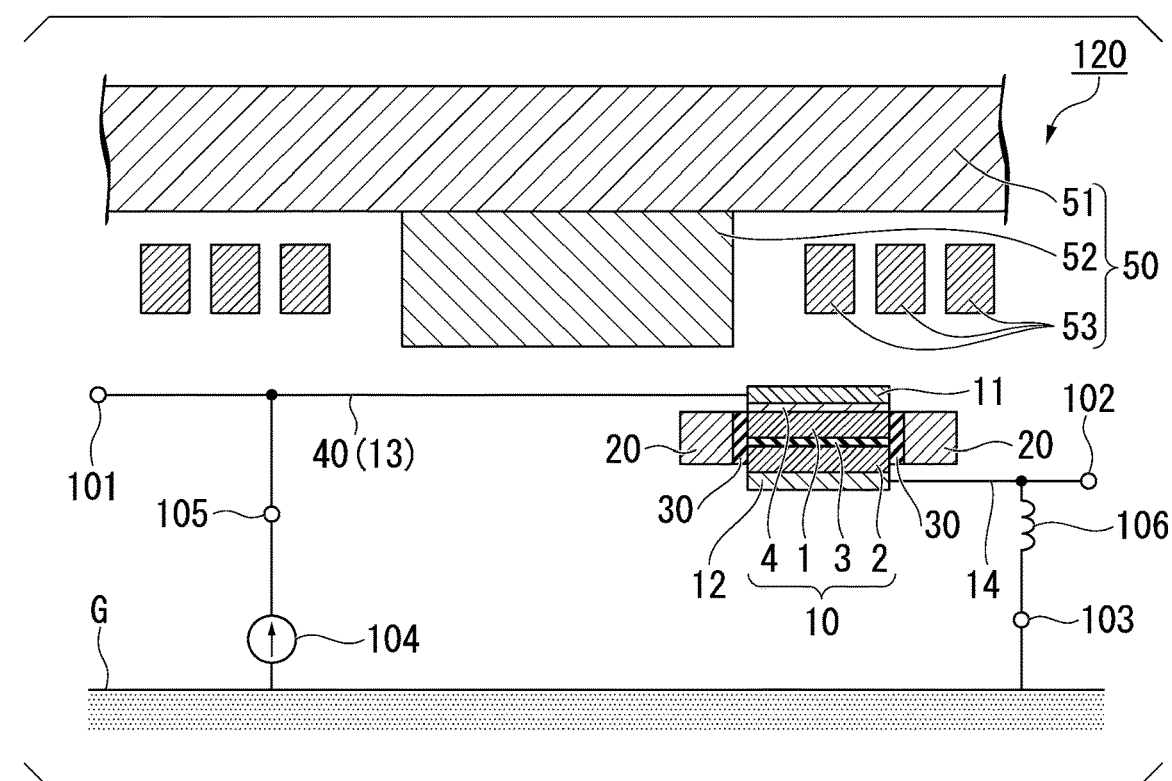
FIG. 10 shows an application example of the high-frequency device of the first embodiment.

FIG. 10 shows another example of the circuit of a high-frequency device to which the high-frequency device 100 of the first embodiment is applied. A high-frequency device 120 is different from the high-frequency device 110 of Application example 1 in a connection relationship of each line. In FIG. 10, the same constituents as in FIG. 9 will be denoted by the same reference numerals. In FIG. 10, the opposing portion 54 of the magnetic field application unit 50 is omitted as in FIG. 9.

In the high-frequency device 120, the high-frequency line 40 also serves as the first line 13. The high-frequency line 40 has the first end connected to the first port 101, and the second end connected to the upper electrode 11. The power supply 104 is connected to the high-frequency line 40, and the inductor 106 is connected to the second line 14.

The high-frequency device 120 shown in FIG. 10 is a current-driven high-frequency device. A current-driven high-frequency device is connected to the high-frequency line 40 and the magnetoresistance effect element 10. A high-frequency current flowing inside the high-frequency line 40 is input to the magnetoresistance effect element 10, and thereby the high-frequency device 120 functions.

In the high-frequency device 120, a signal is input from the first port 101 and a signal is output from the second port 102. A high-frequency current input from the first port 101 flows inside the magnetoresistance effect element 10 in the lamination direction via the high-frequency line 40.

The magnetization of the first ferromagnetic layer 1 oscillates due to spin transfer torque generated by a high-frequency current. The magnetization of the first ferromagnetic layer 1 largely oscillates when a frequency of the high-frequency current is in the vicinity of the ferromagnetic resonance frequency of the first ferromagnetic layer 1 (in this case, referred to as spin torque resonance frequency of the magnetoresistance effect element 10). The magnetization of the first ferromagnetic layer 1 periodically oscillates, and thereby the resistance value of the magnetoresistance effect element 10 periodically changes.

If a DC current or a DC voltage is applied to the magnetoresistance effect element 10 such that the DC current flows from the first ferromagnetic layer 1 to the second ferromagnetic layer 2, the resistance value of the magnetoresistance effect element 10 periodically changes in a phase with a high-frequency current. A change in this resistance value is output from the second port 102. When the change in resistance value of the magnetoresistance effect element 10 is greater, a larger output signal (output power) is obtained from the second port 102.

When the frequency of a high-frequency signal input from the first port 101 is a frequency in the vicinity of the ferromagnetic resonance frequency of the first ferromagnetic layer 1, the variance amount of the resistance value of the magnetoresistance effect element 10 becomes large, and a large signal is output from the second port 102. On the other hand, when the frequency of a high-frequency signal deviates from the ferromagnetic resonance frequency of the first ferromagnetic layer 1, the variance amount of the resistance value of the magnetoresistance effect element 10 becomes small, and a signal is hardly output from the second port 102. That is, the high-frequency device 120 functions as a high-frequency filter which selectively causes a high-frequency signal of a specific frequency to pass.

On the other hand, a DC current or a DC voltage is applied to the magnetoresistance effect element 10 such that the DC current flows from the second ferromagnetic layer 2 to the first ferromagnetic layer 1, the resistance value of the magnetoresistance effect element 10 periodically changes in a phase shifted 180° from a high-frequency current. In this case, an output signal (output power) from the second port 102 can be reduced as the variance amount of the resistance value of the magnetoresistance effect element 10 increases. In this case, the high-frequency device 120 functions as a high-frequency filter which selectively cuts off the high-frequency signal of a specific frequency.

Application Example 3

Figure 11:
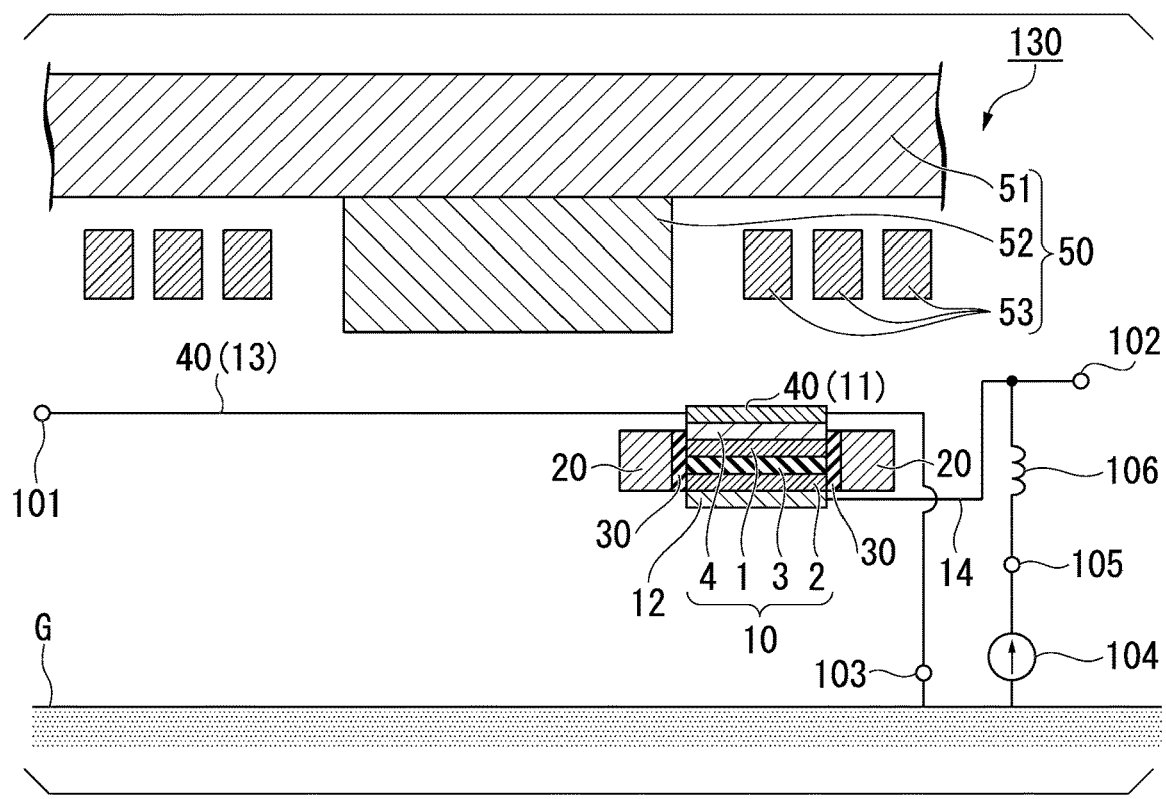
FIG. 11 shows an application example of the high-frequency device of the first embodiment.

FIG. 11 shows another example of the circuit of a high-frequency device to which the high-frequency device of the first embodiment is applied. A high-frequency device 130 is different from the high-frequency device 110 of Application example 1 in connection relationship of each line. In FIG. 11, the same constituents as in FIG. 9 will be denoted by the same reference numerals. In FIG. 11, the opposing portion 54 of the magnetic field application unit 50 is omitted as in FIG. 9.

In the high-frequency device 130, the high-frequency line 40 serves as the first line 13 and the upper electrode 11. The high-frequency line 40 has the first end connected to the first port 101 and the second end connected to the reference potential terminal 103. The power supply 104 is connected to the second line 14 via the inductor 106.

The high-frequency device 130 shown in FIG. 11 is a current-branching high-frequency device. In the current-branching high-frequency device, the high-frequency line 40 and the magnetoresistance effect element 10 are connected. In the high-frequency device 130, the magnetoresistance effect element 10 is connected in series to the second port 102 as viewed from the first port 101 via the high-frequency line 40 and the second line 14. In addition, a high-frequency current reaching the upper electrode 11 branches into a magnetoresistance effect element 10 side and a reference potential terminal 103 side. A high-frequency current flowing inside the high-frequency line 40 is input to the magnetoresistance effect element 10, and a high-frequency magnetic field generated in the high-frequency line 40 is applied to the magnetoresistance effect element, and thereby the high-frequency device 130 functions.

In the high-frequency device 130, a signal is input from the first port 101 and a signal is output from the second port 102. A part of the input high-frequency current flows inside the magnetoresistance effect element 10 in the lamination direction via the high-frequency line 40. The high-frequency current flows inside the magnetoresistance effect element 10 in the lamination direction, and thereby spin transfer torque acts upon the magnetization of the first ferromagnetic layer 1. In addition, a part of the high-frequency current flows in a portion corresponding to the upper electrode 11. Spin orbit torque due to a spin current generated in a direction orthogonal to an orientation in which the high-frequency current flows acts upon the magnetization of the first ferromagnetic layer 1. Furthermore, the high-frequency current generates a high-frequency magnetic field, and the high-frequency magnetic field acts upon the magnetization of the first ferromagnetic layer 1. At least one of the high-frequency magnetic field, the spin transfer torque, and the spin orbit torque acts upon the magnetization of the first ferromagnetic layer 1, and thereby the magnetization of the first ferromagnetic layer 1 oscillates.

Application Example 4

Figure 12:
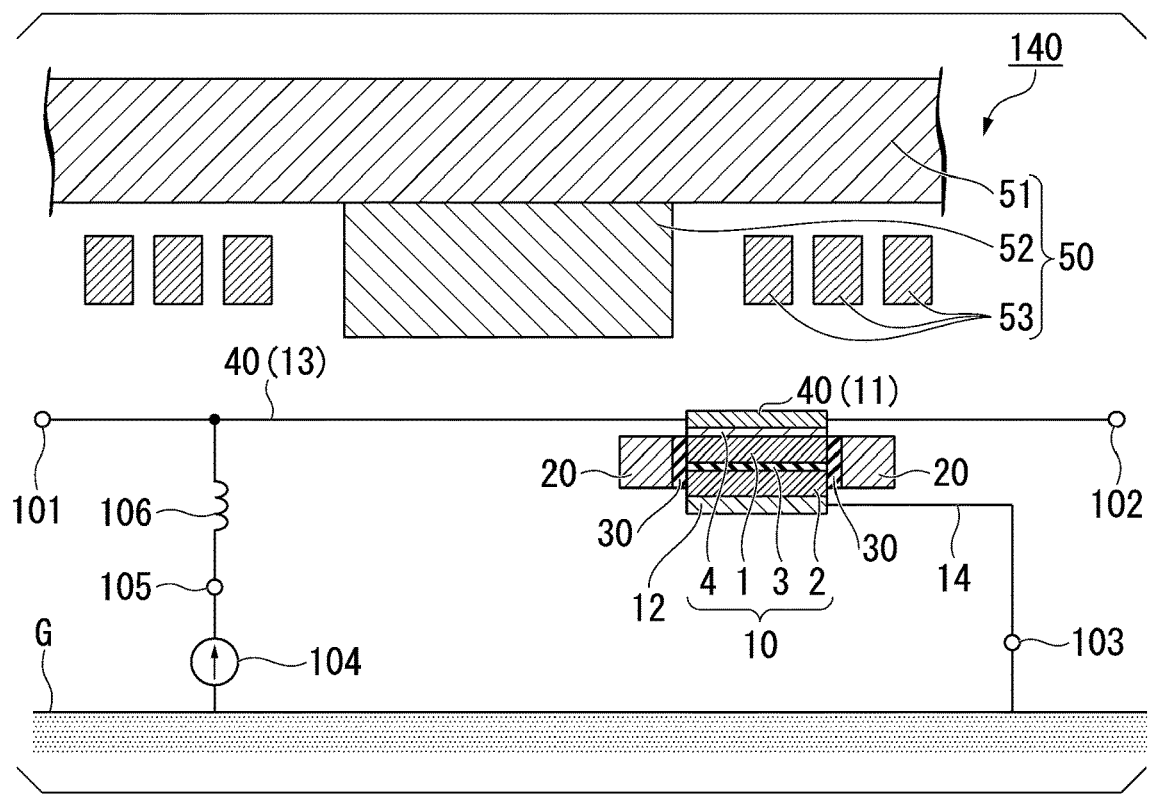
FIG. 12 shows an application example of the high-frequency device of the first embodiment.

FIG. 12 shows another example of the circuit of a high-frequency device to which the high-frequency device of the first embodiment is applied. A high-frequency device 140 is a modified example of the high-frequency device 130 shown in Application example 3. In FIG. 12, the same constituents as in FIG. 11 will be denoted by the same reference numerals. In FIG. 12, the opposing portion 54 of the magnetic field application unit 50 is omitted as in FIG. 9.

In Application example 4, the high-frequency line 40 and the magnetoresistance effect element 10 are connected, but a connection form of the magnetoresistance effect element 10 is different from in Application example 3. While the magnetoresistance effect element 10 is connected in series to the second port 102 as viewed from the first port 101 in Application example 3, the magnetoresistance effect element 10 is connected in parallel to the second port 102 as viewed from the first port 101 via the high-frequency line 40 in Application example 4. In the high-frequency device 140 shown in FIG. 12, the high-frequency line 40 also serves as the upper electrode 11, the first end of the high-frequency line 40 is connected to the first port 101, and the second end of the high-frequency line 40 is connected to the second port 102. Even in this case, as in Application example 3, at least one of the high-frequency magnetic field, the spin transfer torque, and the spin orbit torque acts upon the magnetization of the first ferromagnetic layer 1, and thereby the magnetization of the first ferromagnetic layer 1 oscillates. A signal obtained by combining a signal input from the first port 101 and flowing in the high-frequency line 40 and a signal output from the magnetoresistance effect element 10 is output from the second port 102.

As shown as one of differences between Application example 3 and Application example 4, the DC applied terminal 105 (power supply 104) may be connected between the upper electrode 11 and the ground G, and may also be connected between the lower electrode 12 and the ground G even in Application examples 1 and 2.

Application Example 5

Figure 13:
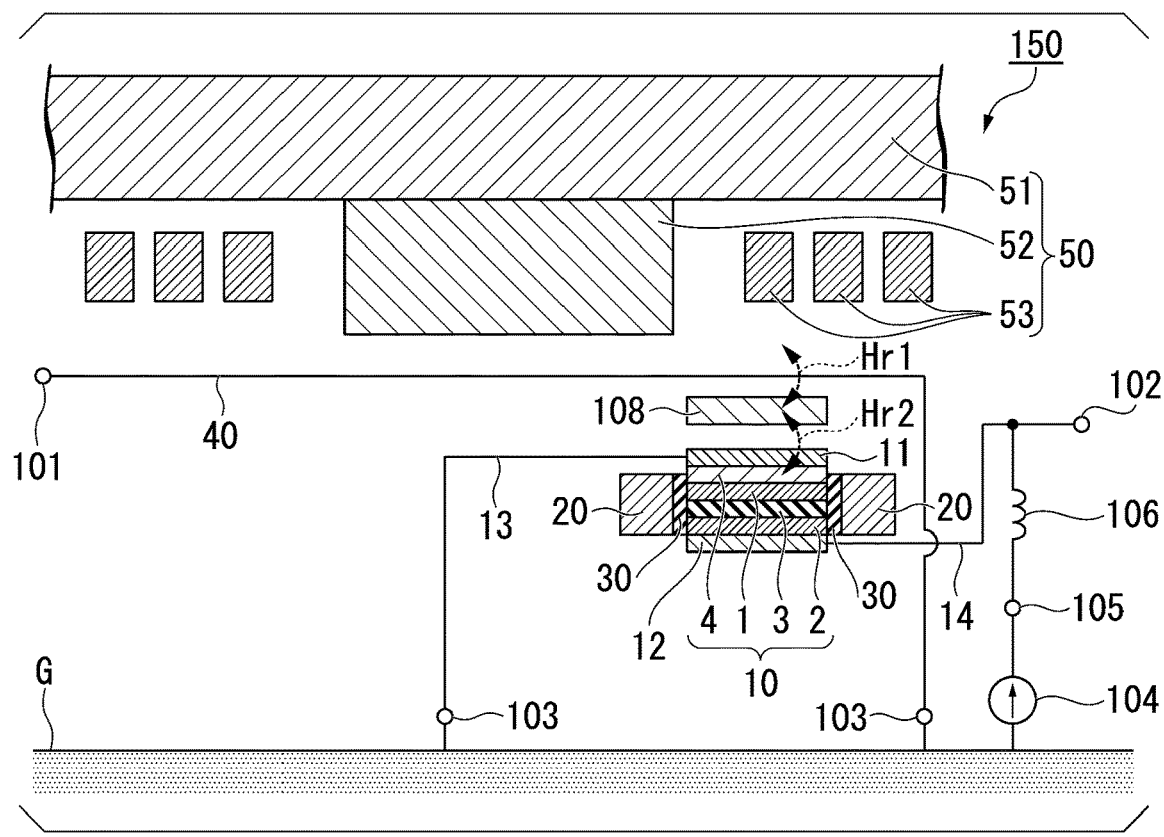
FIG. 13 shows an application example of the high-frequency device of the first embodiment.

FIG. 13 shows another example of a circuit of a high-frequency device to which the high-frequency device 100 of the first embodiment is applied. A high-frequency device 150 is different from the high-frequency device 110 of Application example 1 in that the high-frequency device 150 has a magnetic body portion 108. Constituent elements of FIG. 13 that are the same as those of FIG. 9 will be denoted by the same reference numerals as FIG. 9. In FIG. 13, as in FIG. 9, the opposing portion 54 of the magnetic field application unit 50 is omitted.

The magnetic body portion 108 is, for example, between the high-frequency line 40 and the magnetoresistance effect element 10. The magnetic body portion 108 is arranged apart from the high-frequency line 40 and the magnetoresistance effect element 10. For example, insulators are provided between the magnetic body portion 108 and the high-frequency line 40 and between the magnetic body portion 108 and the magnetoresistance effect element 10.

The magnetic body portion 108 includes a soft magnetic material. The magnetic body portion 108 is, for example, an insulating magnetic body. The magnetic body portion 108 is, for example, a ceramic such as ferrite. The magnetic body portion 108 is, for example, rare earth iron garnet (RIG). Yttrium iron garnet (YIG) is an example of rare earth iron garnet (RIG). The magnetic body portion 108 may be made of, for example, a metal such as permalloy.

A high-frequency magnetic field Hr1 generated from the high-frequency line 40 is applied to the magnetic body portion 108. The magnetization of the magnetic body portion 108 receives the high-frequency magnetic field Hr1 and oscillates. When the high-frequency magnetic field Hr1 includes a signal having a frequency near a ferromagnetic resonance frequency of the magnetic body portion 108, the magnetization of the magnetic body portion 108 largely oscillates at that frequency. The oscillation of the magnetization of the magnetic body portion 108 generates a high-frequency magnetic field Hr2.

The high-frequency magnetic field Hr2 generated due to the oscillation of the magnetization of the magnetic body portion 108 is applied to the first ferromagnetic layer 1. The magnetization of the first ferromagnetic layer 1 oscillates due to the high-frequency magnetic field Hr2 generated from the magnetic body portion 108. That is to say, the high-frequency magnetic field Hr2 resulting from the high-frequency magnetic field Hr1 caused by a high-frequency current flowing through the high-frequency line 40 is applied to the first ferromagnetic layer 1. The high-frequency magnetic field Hr2 generated from the magnetic body portion 108 is an example of a high-frequency magnetic field caused by a high-frequency current flowing through the high-frequency line 40.

The magnetization of the first ferromagnetic layer 1 largely oscillates when a frequency of the high-frequency magnetic field Hr2 caused by the high-frequency current flowing through the high-frequency line 40 is near the ferromagnetic resonance frequency of the first ferromagnetic layer 1.

Other configurations and operations of the high-frequency device 150 are the same as those of the high-frequency device 110 of Application example 1.

Although an example in which the magnetic body portion 108 is between the high-frequency line 40 and the magnetoresistance effect element 10 has been described, the present invention is not limited to this case. If the high-frequency magnetic field Hr1 caused from the high-frequency line 40 is applied to the magnetic body portion 108 and the high-frequency magnetic field Hr2 caused due to the oscillation of the magnetization of the magnetic body portion 108 is applied to the first ferromagnetic layer 1, a position of the magnetic body portion 108 is not limited to this. For example, the magnetic body portion 108 may be disposed such that the high-frequency line 40 is positioned between the magnetic body portion 108 and the magnetoresistance effect element 10.

The high-frequency device in Application example 1 to Application example 5 has only one magnetoresistance effect element 10, but may also have a plurality of magnetoresistance effect elements 10. In this case, the plurality of magnetoresistance effect elements 10 may be connected in parallel to one another, may be connected in series, and may also be connected in a combination of serial connection and parallel connection. For example, a band (a pass frequency band) of a selection frequency can be widen by using the plurality of magnetoresistance effect elements 10 having different ferromagnetic resonance frequencies of the first ferromagnetic layer 1. In addition, in Application examples 1 and 3, a high-frequency magnetic field generated from the second line 14 in which an output signal output from one of the magnetoresistance effect elements 10 flows may be applied to another magnetoresistance effect element 10. Similarly, in Application example 4, a high-frequency magnetic field generated from the high-frequency line 40 in which an output signal output from one of the magnetoresistance effect elements 10 flows may be applied to another magnetoresistance effect element 10. An output signal output from the magnetoresistance effect element 10 is filtered over a plurality of times, and a filtering accuracy of a high-frequency signal increases. Furthermore, in Application example 5, when a plurality of magnetoresistance effect elements 10 are used, a high-frequency magnetic field Hr2 caused due to the oscillation of the magnetization of one magnetic body portion 108 may be applied to first ferromagnetic layers 1 of the plurality of magnetoresistance effect elements 10 or one of a plurality of magnetic body portions 108 may be disposed in each of the magnetoresistance effect elements 10 using the magnetic body portions 108.

In addition, a resistance element may also be used instead of the inductor 106 in Application examples 1 to 5.

This resistance element has a function of cutting a high-frequency component of a current using a resistance component. This resistance element may be any one of chip resistance or resistance caused by a pattern line. The resistance value of this resistance element may be characteristic impedance of the second line 14 or more. For example, when the characteristic impedance of the second line 14 is 50Ω, and the resistance value of a resistance element is 50Ω, it is possible to cut 45% of high-frequency power using the resistance element. In addition, when the characteristic impedance of the second line 14 is 50Ω, and the resistance value of a resistance element is 500Ω, it is possible to cut 90% of high-frequency power using the resistance element. Even in this case, an output signal output from the magnetoresistance effect element 10 can efficiently flow in the second port 102.

In Application examples 1 to 5 described above, when the power supply 104 connected to the DC applied terminal 105 has a function of passing through the invariant component of a current at the same time as cutting the high-frequency component of the current, the inductor 106 may be omitted. Even in this case, an output signal output from the magnetoresistance effect element 10 can efficiently flow in the second port 102. The high-frequency devices 110, 120, 130, 140, and 150 in Application examples 1 to 5 described above are high-frequency devices using a ferromagnetic resonance phenomenon of a magnetization-free layer.

Application Example 6

In Application examples 1 to 5, a case in which a high-frequency device is used as a high-frequency filter is exemplified. A high-frequency device is also applicable to an oscillator using a spin torque oscillation phenomenon by which oscillation occurs in the magnetization of the first ferromagnetic layer 1. The magnetization of the first ferromagnetic layer 1 oscillates by applying a DC current having a current density equal to or greater than an oscillation threshold current density to the magnetoresistance effect element 10.

Figure 14:
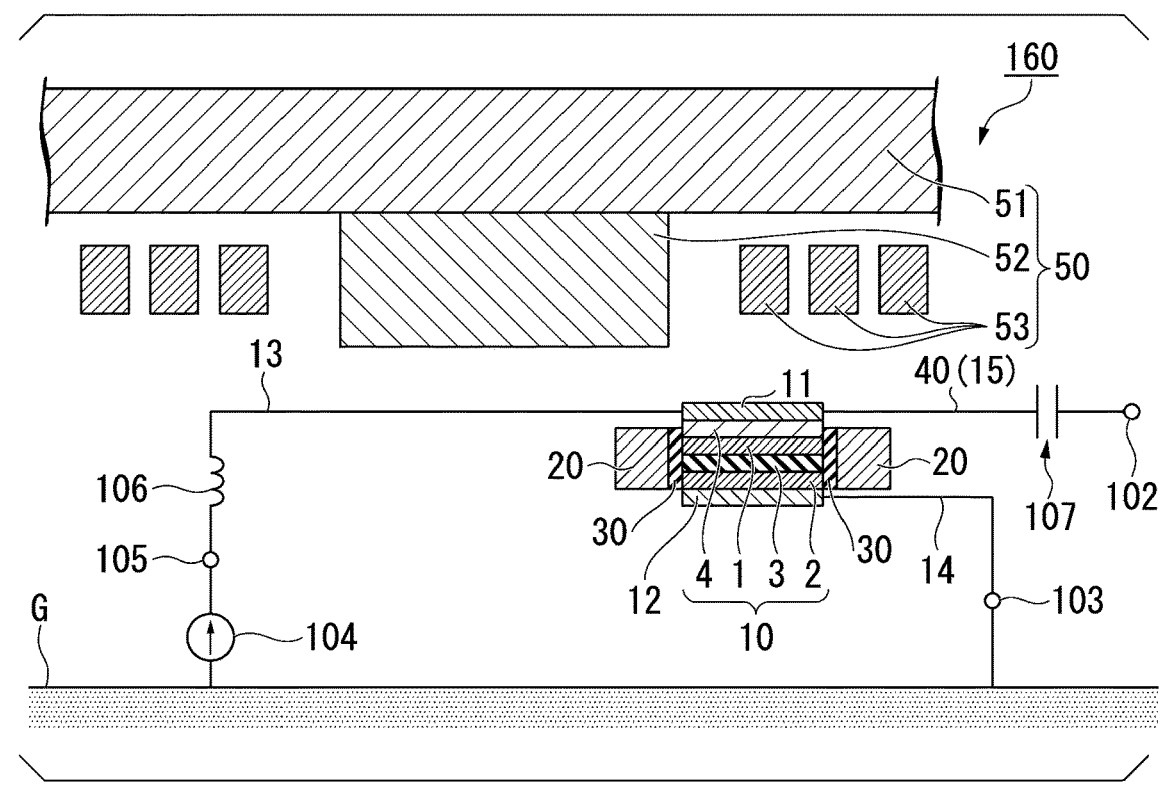
FIG. 14 shows an application example of the high-frequency device of the first embodiment.

FIG. 14 shows another example of a circuit of a high-frequency device to which the high-frequency device of the first embodiment is applied. A high-frequency device 160 shown in FIG. 14 functions as an oscillator. The same constituents as in FIG. 9 will be denoted by the same reference numerals. In FIG. 14, as in FIG. 9, the opposing portion 54 of the magnetic field application unit 50 is omitted.

In the high-frequency device 160, the magnetization of the first ferromagnetic layer 1 functioning as a magnetization-free layer oscillates due to spin torque generated when a DC current is applied to the magnetoresistance effect element 10. A high-frequency voltage corresponding to the ferromagnetic resonance frequency of the first ferromagnetic layer 1 is generated from the magnetoresistance effect element 10. As a result, a high-frequency current output from the magnetoresistance effect element 10 flows in a third line 15 on a second port (output port) 102 side connected to the magnetoresistance effect element 10. That is, in the high-frequency device 150 shown in FIG. 14, the third line 15 corresponds to the high-frequency line 40. The third line (high-frequency line) 15 is connected to the magnetoresistance effect element 10, and outputs a high-frequency current from the magnetoresistance effect element 10. In the example shown in FIG. 14, the inductor 106 is connected to the first line 13 on a DC applied terminal 105 side, and a capacitor 107 is connected between (to the third line 15) the upper electrode 11 and the second port 102.

Application Example 7

Figure 15:
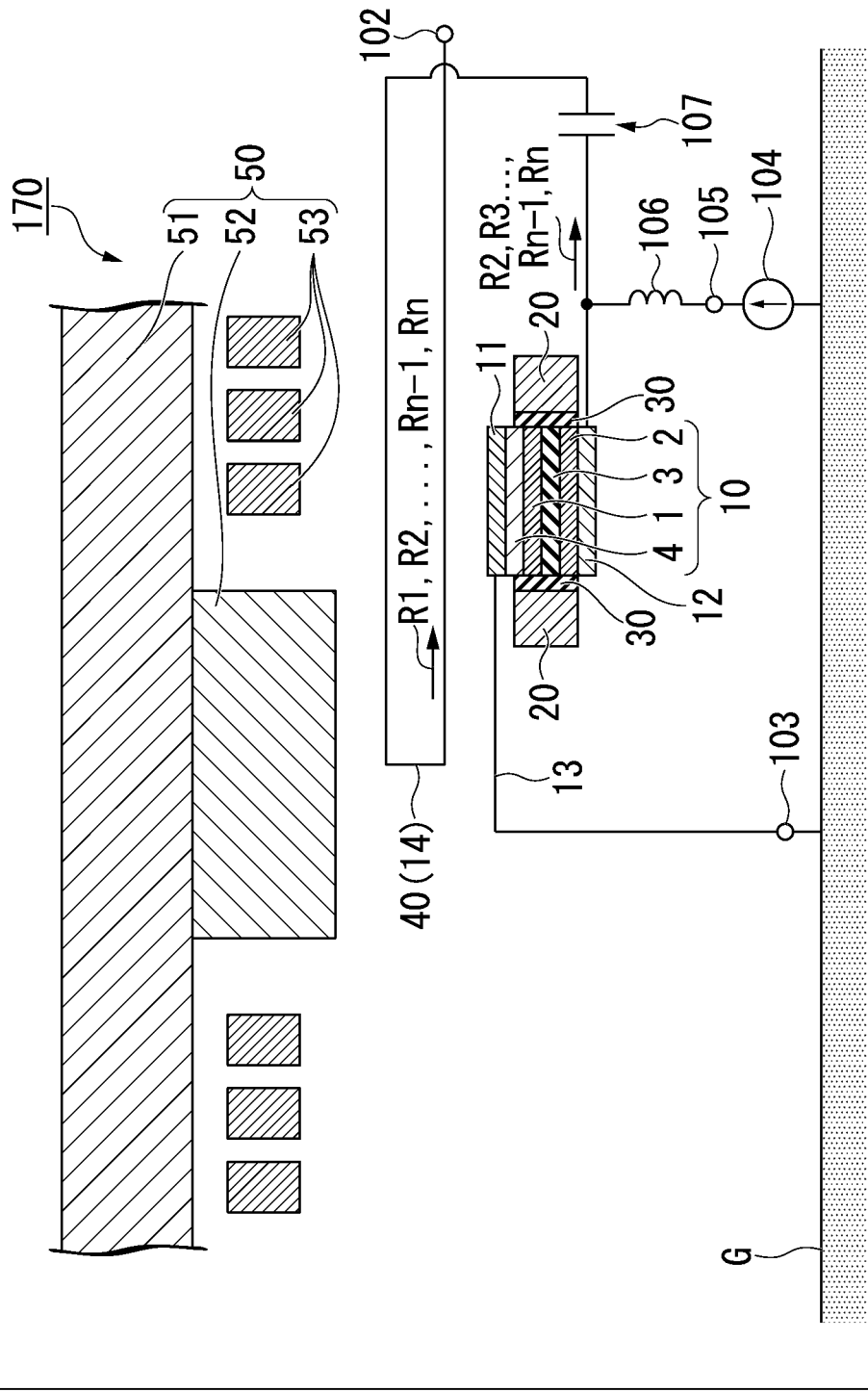
FIG. 15 shows an application example of the high-frequency device of the first embodiment.

FIG. 15 shows another example of the circuit of a high-frequency device to which the high-frequency device of the first embodiment is applied. A high-frequency device 170 shown in FIG. 15 functions as an oscillator. Constituent elements of FIG. 15 that are the same as those of FIG. 9 will be denoted by the same reference numerals as in FIG. 9. In FIG. 15, an opposing portion 54 of a magnetic field application unit 50 is omitted as in FIG. 9.

In the high-frequency device 170, a high-frequency line 40 also functions as a second line 14. The high-frequency line 40 has a first end connected to a lower electrode 12 and a second end connected to a second port 102. A power supply 104 is connected to a magnetoresistance effect element 10 via an inductor 106. Furthermore, a capacitor 107 is disposed between a connection point between the high-frequency line 40 and a line reaching the power supply 104 and the second port 102.

In the high-frequency device 170, a high-frequency magnetic field caused when a high-frequency current flows through the high-frequency line 40 oscillates the magnetization of a first ferromagnetic layer 1 functioning as a magnetization-free layer. A first signal R1 which generates a high-frequency current is generated, for example, due to noise occurring when a power supply 104 is turned on.

When the signal R1 includes a signal of a frequency near a ferromagnetic resonance frequency of the first ferromagnetic layer 1, the magnetization of the first ferromagnetic layer 1 oscillates greatly at that frequency.

The power supply 104 applies a direct current to the magnetoresistance effect element 10. The direct current flows in a direction in which the magnetoresistance effect element 10 is laminated. The direct current flows from a reference potential terminal 103 to the ground G through a first line 13. A potential of the magnetoresistance effect element 10 changes in accordance with Ohm's law. A signal R2 which is a high-frequency signal is generated in accordance with a change in potential (a change in resistance value) of the magnetoresistance effect element 10. The signal R2 is output from the magnetoresistance effect element 10 to the high-frequency line 40.

The signal R2 passes through the high-frequency line 40 and reaches the second port 102. The high-frequency current flowing through the high-frequency line 40 on the basis of the signal R2 causes a high-frequency magnetic field. The high-frequency magnetic field is applied to the first ferromagnetic layer 1 of the magnetoresistance effect element 10. The magnetoresistance effect element 10 receives the high-frequency magnetic field and outputs a signal R3 which is a high-frequency signal to the high-frequency line 40. The signal R3 flows through the high-frequency line 40 and reaches the second port 102. The high-frequency current flowing through the high-frequency line 40 on the basis of the signal R3 causes a high-frequency magnetic field again. The high-frequency device 170 repeatedly performs this cycle.

A cycle in which a signal passes through the high-frequency line 40, a high-frequency magnetic field due to this signal is applied to the first ferromagnetic layer 1, and the magnetoresistance effect element 10 outputs a signal to the high-frequency line 40 is one cycle.

The magnetization of the first ferromagnetic layer 1 of the magnetoresistance effect element 10 oscillates greatly near the ferromagnetic resonance frequency and does not oscillate significantly at frequencies outside the vicinity of the ferromagnetic resonance frequency. If the magnetization of the first ferromagnetic layer 1 oscillates greatly, a change in resistance of the magnetoresistance effect element 10 is large and a large signal is output from the magnetoresistance effect element 10. Therefore, with each cycle, in an output signal and an input signal, a relative intensity of a signal of a frequency near the ferromagnetic resonance frequency with respect to signals of frequencies outside the vicinity of the ferromagnetic resonance frequency increases (a frequency is filtered). As a result, the frequency selectivity of the high-frequency device 170 is improved.

Here, a ratio between an input signal and an output signal is referred to as an "S21 parameter" (hereinafter referred to as "S21"). S21 is represented by $[S21(dB)]=10\times\log_{10}$ ([an output signal intensity]/[an input signal intensity]). Hereinafter, a ratio between an input signal passing through the high-frequency line 40 (for example, the signal R1) and an output signal output from the magnetoresistance effect element 10 (for example, the signal R2) in each cycle is referred to as a "first S parameter." When the output signal output from the magnetoresistance effect element 10 is larger than the input signal passing through the high-frequency line 40 in each cycle, the first S parameter is positive. On the other hand, when the output signal output from the magnetoresistance effect element 10 is smaller than the input signal passing through the high-frequency line 40 in each cycle, the first S parameter is negative.

When the first S parameter is positive, the input signal passing through the high-frequency line 40 and the output signal output from the magnetoresistance effect element 10 increase each time the cycle is repeatedly performed. The first S parameter can be adjusted, for example, by adjusting an amount of direct current applied from the DC applied terminal 105 to the magnetoresistance effect element 10. An intensity of the output signal from the magnetoresistance effect element 10 increases to a certain constant value when the intensity of the input signal increases and becomes gradually saturated. Along with this, an intensity of the input signal passing through the high-frequency line 40 becomes gradually saturated.

When the first S parameter is negative, the input signal and the output signal decrease and attenuate each time the cycle is repeatedly performed. Each time the cycle is repeatedly performed, in the high-frequency device 170, in the input signal and the output signal, a relative intensity of the signal of the frequency near the ferromagnetic resonance frequency with respect to the signal of another frequency increases. The relative intensity of the signal of the frequency near the ferromagnetic resonance frequency with respect to the signal of the other frequency increases by performing adjustment so that the first S parameter near the ferromagnetic resonance frequency is positive and the first S parameter at frequencies outside the vicinity of the ferromagnetic resonance frequency is negative.

The high-frequency device 170 can selectively amplify the intensity of the signal of the frequency near the ferromagnetic resonance frequency to an output saturation value of the magnetoresistance effect element 10 each time the cycle is repeatedly performed. If the intensity of the output signal reaches the output saturation value of the magnetoresistance effect element 10, the high-frequency device 170 outputs a signal of a stable intensity at the frequency near the ferromagnetic resonance frequency from the second port 102. In this way, the high-frequency device 170 functions as an oscillator having a large difference in output characteristics between an oscillation band and other bands.

Application Example 8

Figure 16:
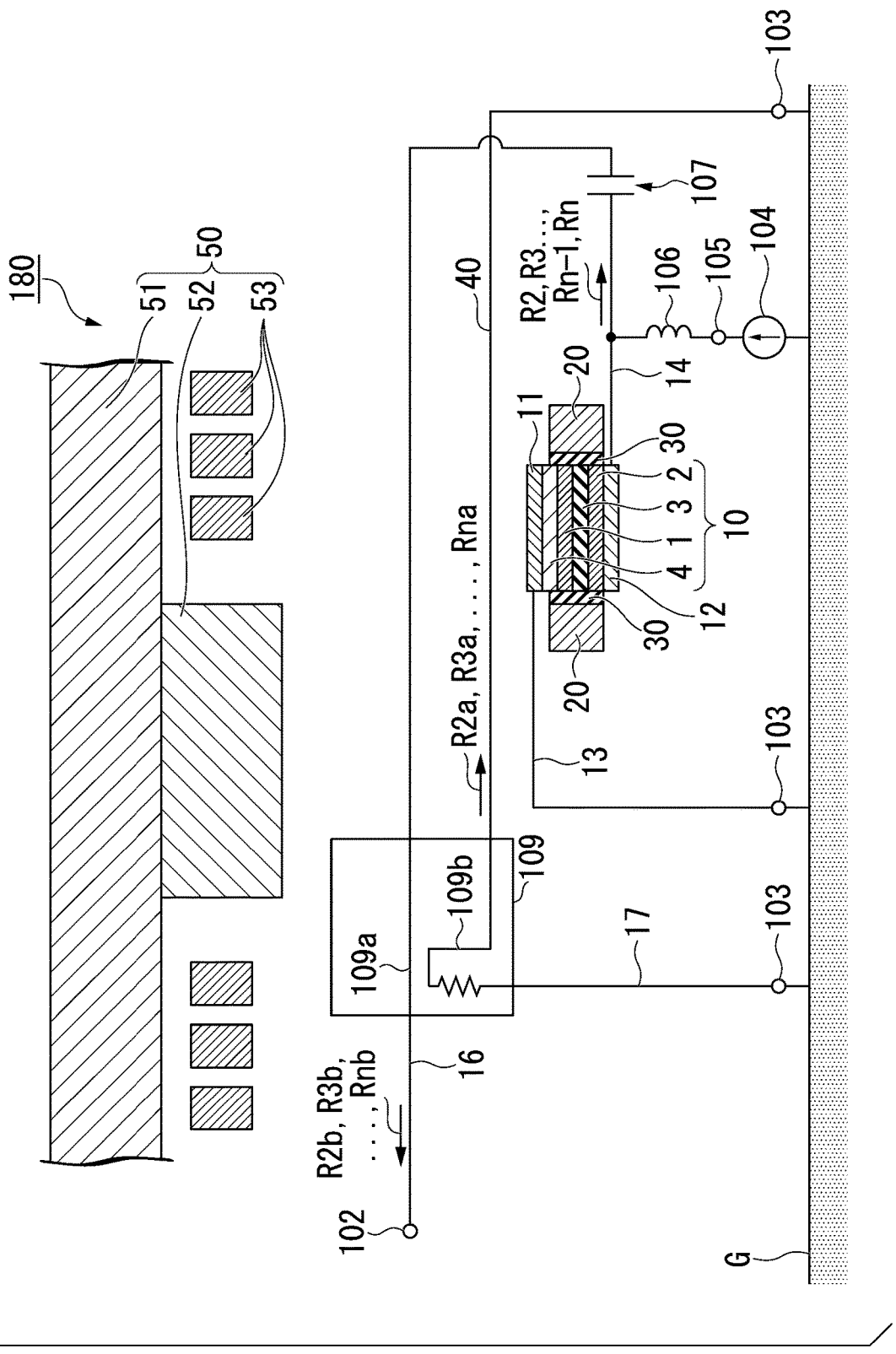
FIG. 16 shows an application example of the high-frequency device of the first embodiment.

FIG. 16 shows another example of the circuit of a high-frequency device to which the high-frequency device of the first embodiment is applied. A high-frequency device 180 shown in FIG. 16 functions as an oscillator. Constituent elements of FIG. 16 that are the same as those of FIG. 15 will be denoted by the same reference numerals as in FIG. 15. In FIG. 16, an opposing portion 54 of a magnetic field application unit 50 is omitted as in FIG. 9.

The high-frequency device 180 has a branch portion 109. A second line 14 shown in FIG. 16 has a first end connected to a lower electrode 12 and a second end connected to the branch portion 109. A high-frequency line 40 shown in FIG. 16 has a first end connected to the branch portion 109 and a second end connected to a reference potential terminal 103. The reference potential terminal 103 connected to the high-frequency line 40 may be an output terminal. Furthermore, the branch portion 109 is connected to a second port 102 via a line 16.

The branch portion 109 branches a signal from the second line 14 into the line 16 and the high-frequency line 40. The branch portion 109 has, for example, a main line 109a and a sub-line 109b therein. The main line 109a connects the second line 14 to the line 16. The sub-line 109b connects a line 17 to the high-frequency line 40. The line 17 is connected to the reference potential terminal 103 connected to a reference potential. The main line 109a is electromagnetically joined (line-joined) to the sub-line 109b. The sub-line 109b has a resistance.

The branch portion 109 is, for example, a directional coupler as shown in FIG. 16. The branch portion 109 is not limited to a directional coupler as long as it can branch a signal. For example, some of signals input from the second line 14 are output to the line 16 and some of the signals are output to the high-frequency line 40. A proportion at which the input signals are divided is arbitrary. On the other hand, if a signal is input from the line 16 to the branch portion 109, most of the signals are output to the second line 14 via the main line 109a without being attenuated. This is because the sub-line 109b has a resistance and it is difficult for a signal to branch toward the line 17. A function of the directional coupler differs in accordance with a direction of a signal to be input to the branch portion 109.

In the high-frequency device 180, the magnetization of the first ferromagnetic layer 1 functioning as a magnetization-free layer due to a high-frequency magnetic field caused when a high-frequency current flows through the high-frequency line 40 oscillates. A first signal R1 which generates a high-frequency current is generated, for example, due to noise occurring when the power supply 104 is turned on. When the signal R1 includes a signal of a frequency near the ferromagnetic resonance frequency of the first ferromagnetic layer 1, the magnetization of the first ferromagnetic layer 1 oscillates greatly at that frequency.

The power supply 104 applies a direct current to the magnetoresistance effect element 10. The direct current flows in a direction in which the magnetoresistance effect element 10 is laminated. The direct current flows from the reference potential terminal 103 to the ground G through the first line 13. A potential of the magnetoresistance effect element 10 changes in accordance with Ohm's law. A signal R2 which is a high-frequency signal is generated in accordance with a change in potential (a change in resistance value) of the magnetoresistance effect element 10. The signal R2 is output from the magnetoresistance effect element 10 to the second line 14.

A signal output as a high-frequency current from the magnetoresistance effect element 10 passes through the second line 14 and reaches the branch portion 109. For example, the branch portion 109 divides the signal R2 into a signal R2a and a signal R2b. The signal R2a is a signal which passes through the high-frequency line 40 and reaches the ground G via the reference potential terminal 103. The signal R2b is a signal which is output to the second port 102.

A high-frequency current caused by the signal R2a causes a high-frequency magnetic field. The high-frequency magnetic field is applied to the first ferromagnetic layer 1 of the magnetoresistance effect element 10. A signal R3 corresponding to the ferromagnetic resonance frequency of the first ferromagnetic layer 1 is generated again from the magnetoresistance effect element 10. As a result, a high-frequency current to be output from the magnetoresistance effect element 10 flows through the second line 14 and the high-frequency line 40 connected to the magnetoresistance effect element 10 and causes a high-frequency magnetic field again. The high-frequency device 180 repeatedly performs this cycle.

The magnetization of the first ferromagnetic layer 1 of the magnetoresistance effect element 10 oscillates greatly in the vicinity of the ferromagnetic resonance frequency and does not oscillate significantly at frequencies outside the vicinity of the ferromagnetic resonance frequency. Therefore, each time each cycle is performed, in the output signal and the input signal, a relative intensity of the signal of the frequency near the ferromagnetic resonance frequency with respect to the signal of the frequency outside the vicinity of the ferromagnetic resonance frequency increases (a frequency is filtered). As a result, the frequency selectivity of the high-frequency device 180 is improved.

If the first S parameter (S21 of the high-frequency line 40 and the magnetoresistance effect element 10) is set to be positive at the frequency near the ferromagnetic resonance frequency of the first ferromagnetic layer 1, as in Application example 7, an intensity of the input signal (R2a, R3a, ... Rn–1a, or Rna) passing through the high-frequency line 40 gradually increases each time the cycle is repeatedly performed (n is a natural number of 2 or more). As a result, an intensity of the output signal (R2, R3, ..., or Rn) to be output from the magnetoresistance effect element 10 gradually increases until the intensity reaches an output saturation value of the magnetoresistance effect element 10. As a result, an intensity of the signal (R2b, R3b, ..., or Rnb) to be output to the second port 102 gradually increases until an output of the magnetoresistance effect element 10 is saturated. Therefore, the high-frequency device 180 can selectively amplify an intensity of a signal of the frequency near the ferromagnetic resonance frequency until the output of the magnetoresistance effect element 10 is saturated each time the cycle is repeatedly performed, as in the high-frequency device 170 of Application example 7. When the output of the magnetoresistance effect element 10 is saturated, the high-frequency device 180 outputs a signal having a stable intensity (for example, the signal Rnb) from the second port 102.

Application Example 9

Figure 17:
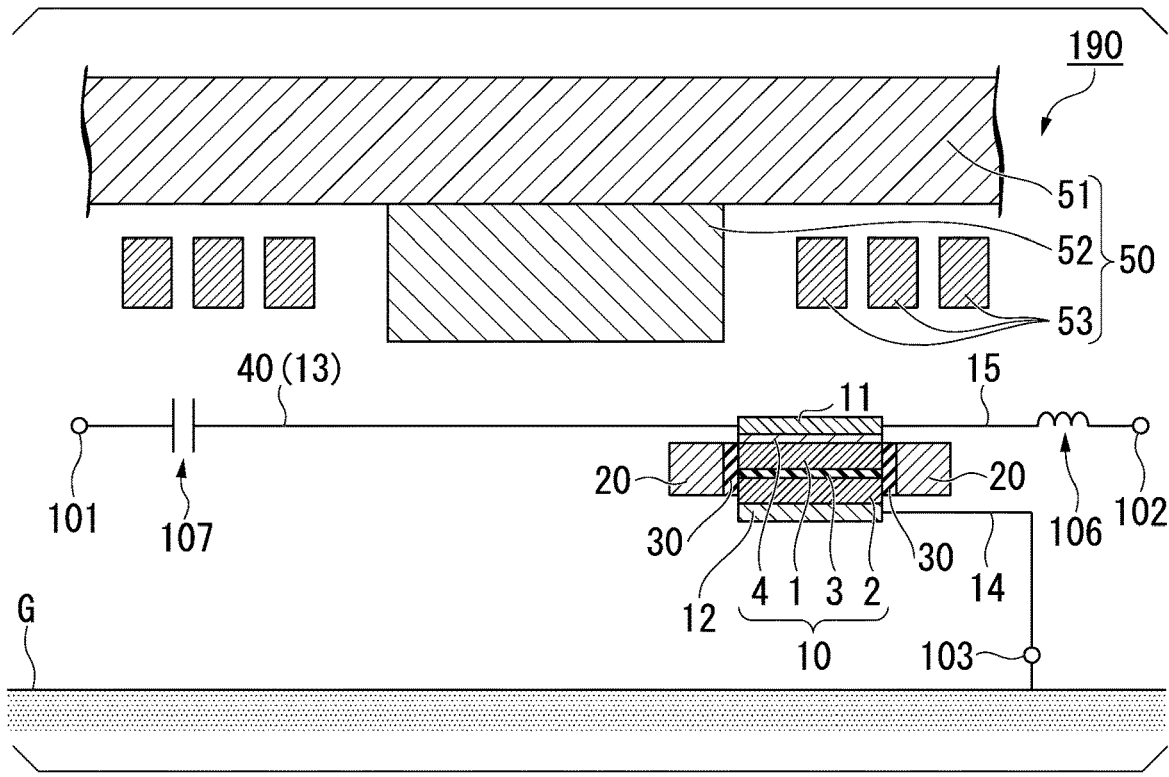
FIG. 17 shows an application example of the high-frequency device of the first embodiment.

FIG. 17 shows another example of the circuit of a high-frequency device to which the high-frequency device of the first embodiment is applied. A high-frequency device 190 shown in FIG. 17 can be applied to a rectifier or a wave detector which uses a spin torque diode effect generated by a DC voltage due to the ferromagnetic resonance phenomenon of a magnetization-free layer when a high-frequency current (alternating current) is applied to a magnetoresistance effect element. FIG. 17 is a diagram which shows a configuration example of a circuit in a case in which the high-frequency device 190 is applied as a rectifier. The same constituents as in FIG. 9 will be denoted by the same reference numerals. In FIG. 17, as in FIG. 9, the opposing portion 54 of the magnetic field application unit 50 is omitted. The high-frequency device 190 is a high-frequency device which uses the ferromagnetic resonance phenomenon of a magnetization-free layer.

In the high-frequency device 190, the high-frequency line 40 also serves as the first line 13. A high-frequency current is input from the first port 101 to the magnetoresistance effect element 10 via the high-frequency line 40, and a DC voltage is output from the second port (output port) 102. The high-frequency line 40 is connected to the magnetoresistance effect element 10, and a high-frequency current is input to the magnetoresistance effect element 10. If a high-frequency current flowing in the high-frequency line 40 is input to the magnetoresistance effect element 10, a DC voltage is generated from the magnetoresistance effect element 10. This DC voltage is output from the second port 102. In Application example 9 shown in FIG. 17, the capacitor 107 is connected to the high-frequency line 40, and the inductor 106 is connected to the third line 15.

Application Example 10

Figure 18:
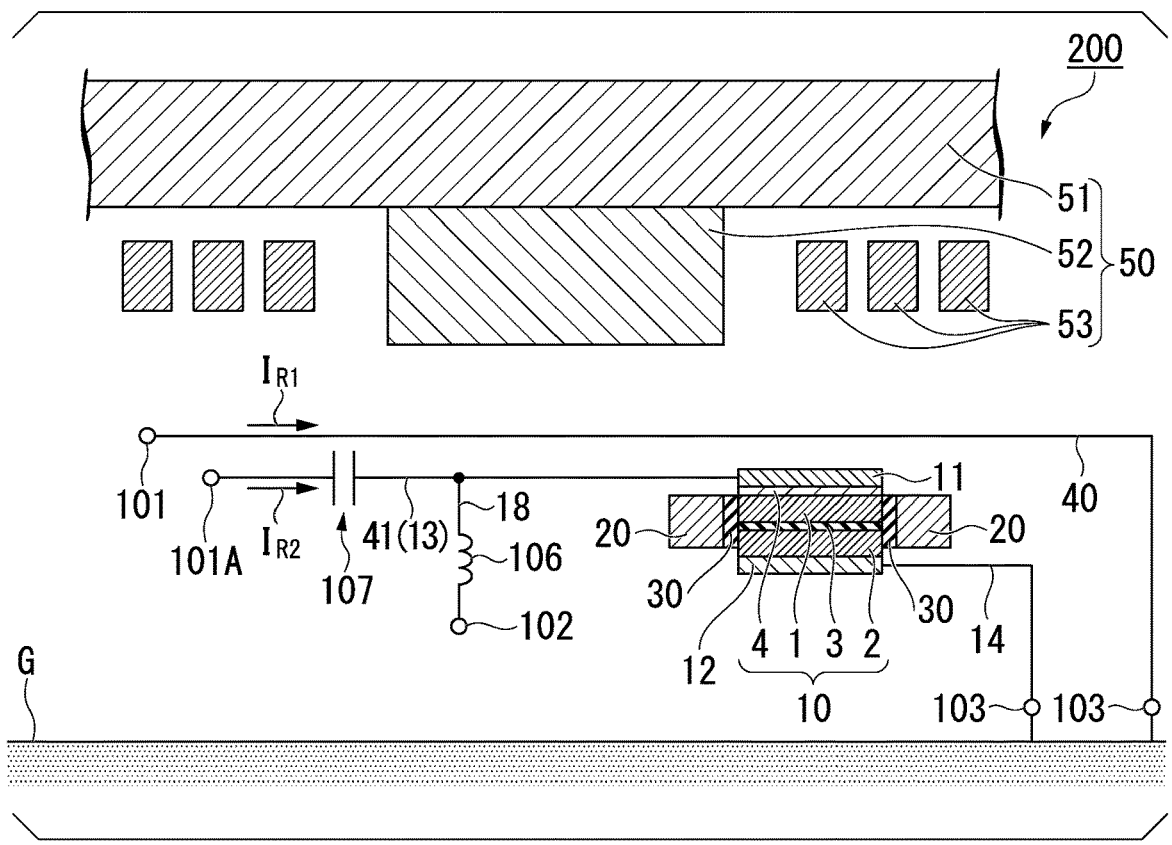
FIG. 18 shows an application example of the high-frequency device of the first embodiment.

FIG. 18 shows another example of the circuit of a high-frequency device to which the high-frequency device of the first embodiment is applied. A high-frequency device 200 shown in FIG. 18 functions as, for example, a sensor, a rectifier, or the like. Constituent elements of FIG. 18 that are the same as those of FIG. 9 will be denoted by the same reference numerals as those of FIG. 9. In FIG. 18, an opposing portion 54 of a magnetic field application unit 50 is omitted as in FIG. 9.

The high-frequency device 200 shown in FIG. 18 has a high-frequency line 40 and a high-frequency line 41. The high-frequency line 41 also functions as a first line 13. The high-frequency line 13 (the high-frequency line 41) shown in FIG. 18 has a first end connected to a third port 101A and a second end connected to an upper electrode 11. A line 18 reaching a second port 102 is connected to the first line 13. For example, a capacitor 107 is present in the first line 13 and an inductor 106 is present in the line 18. A second line 14 shown in FIG. 18 has a first end connected to a lower electrode 12 and a second end connected to a reference potential terminal 103. The third port 101A is an input terminal of the high-frequency device 200.

In the high-frequency device 200 shown in FIG. 18, the magnetization of the first ferromagnetic layer 1 oscillates by a high-frequency magnetic field caused by a high-frequency current $I_{R1}$ flowing through the high-frequency line 40. When a second high-frequency signal is input from an alternating current (AC) signal source connected to the third port 101A to the third port 101A, a high-frequency current $I_{R2}$ flows to the first line 13. The high-frequency current $I_{R2}$ flows through the magnetoresistance effect element 10. An amplitude of the oscillation of the magnetization of the first ferromagnetic layer 1 due to the high-frequency magnetic field to be applied to the first ferromagnetic layer 1 is larger than an amplitude of the oscillation of the magnetization of the first ferromagnetic layer 1 due to the spin transfer torque occurring due to the high-frequency current $I_{R2}$ flowing through the magnetoresistance effect element 10.

When the high-frequency current $I_{R1}$ and the high-frequency current $I_{R2}$ are input to the high-frequency device 200, a voltage caused by an output from the magnetoresistance effect element 10 is output from the second port 102. In the example shown in FIG. 18, since the inductor 106 is present in the line 18, a DC voltage is output. When the high-frequency device 200 outputs a DC voltage from the second port 102, the high-frequency device 200 functions as a sensor or a rectifier. When the high-frequency device 200 is used for applications other than the rectifier, the inductor 106 in the high-frequency device 200 may be replaced with, for example, a filter such as a high pass filter or a low pass filter. In this case, an AC voltage is output from the second port 102.

A voltage V which is a product of a resistance $R_{10}$ of the magnetoresistance effect element 10 changing when a high-frequency magnetic field caused by the high-frequency current $I_{R1}$ is applied and a current (the high-frequency current $I_{R2}$) flowing through the magnetoresistance effect element 10 is represented as follows:

$$V = I_{R2} \times R_{10} = (A \cdot B/2) \cdot \{\cos(\Delta\theta_1) - \cos(4\pi ft + \Delta\theta_1)\} + A \cdot R_0 \cdot \sin(2\pi ft)$$

"A" is an amplitude of the high-frequency current $I_{R2}$, "B" is an amplitude of the resistance $R_{10}$ of the magnetoresistance effect element 10, $R_0$ is a resistance component of the resistance of the magnetoresistance effect element 10 which does not depend on a relative angle between the magnetization of the first ferromagnetic layer 1 and the magnetization of the second ferromagnetic layer 2, "f" is a frequency, "t" is time, and $\Delta\theta_1$ is a phase difference between a phase of the high-frequency current $I_{R2}$ and a phase of the resistance $R_{10}$ of the magnetoresistance effect element 10.

The phase difference $\Delta\theta_1$ changes due to a change in magnitude of an external magnetic field, a change in direction, a change in dielectric constant near the high-frequency line 40 or the high-frequency line 41, and the like. If the phase difference $\Delta\theta_1$ changes, a signal to be output from the second port 102 changes. Thus, the high-frequency device 200 functions as a magnetic sensor or a sensor such as a sensor capable of measuring an amount of moisture or the like from a change in dielectric constant.

Application Example 11

Figure 19:
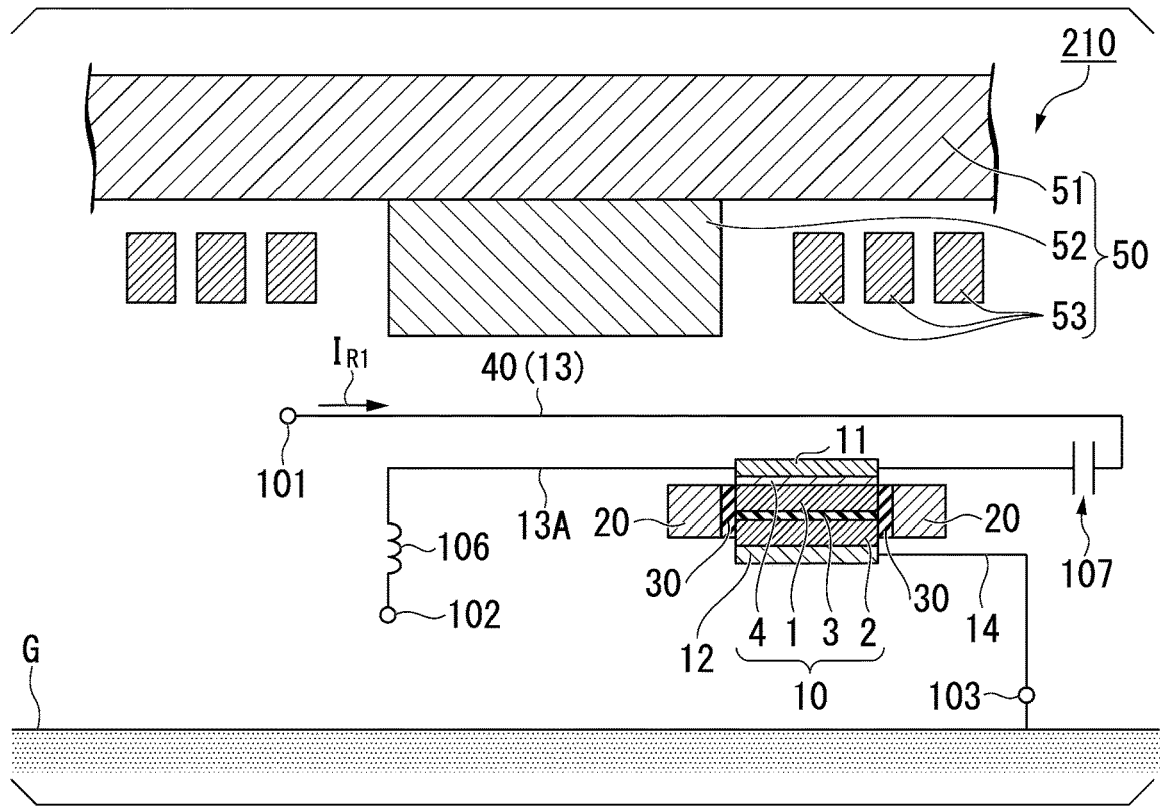
FIG. 19 shows an application example of the high-frequency device of the first embodiment.

FIG. 19 shows another example of the circuit of the high-frequency device to which the high-frequency device of the first embodiment is applied. A high-frequency device 210 shown in FIG. 19 functions as, for example, a sensor, a rectifier, or the like. Constituent elements of FIG. 19 that are the same as those of FIG. 9 will be denoted by the same reference numeral as FIG. 9. In FIG. 19, an opposing portion 54 of a magnetic field application unit 50 is omitted as in FIG. 9.

A high-frequency line 40 shown in FIG. 19 has a first end connected to a first port 101 and a second end connected to an upper electrode 11. The high-frequency line 40 also functions as a first line 13. Furthermore, a line 13A connected to a second port 102 is connected to the upper electrode 11. For example, a capacitor 107 is present in the high-frequency line 40 and an inductor 106 is present in the line 13A. A second line 14 shown in FIG. 19 has a first end connected to a lower electrode 12 and a second end connected to a reference potential terminal 103.

In the high-frequency device 210 shown in FIG. 19, the magnetization of a first ferromagnetic layer 1 oscillates by a high-frequency magnetic field caused by a high-frequency current $I_{R1}$ flowing through the high-frequency line 40. Furthermore, the high-frequency current $I_{R1}$ flowing through the high-frequency line 40 flows through a magnetoresistance effect element 10.

When the high-frequency current $I_{R1}$ is input to the high-frequency device 210, a voltage caused by an output from the magnetoresistance effect element 10 is output from the second port 102. In the example shown in FIG. 19, since the inductor 106 is present in the line 13A, a DC voltage is output. When the high-frequency device 210 outputs a DC voltage from the second port 102, the high-frequency device 210 functions as a sensor or a rectifier. When the high-frequency device 210 is used for applications other than a rectifier, the inductor 106 in the high-frequency device 210 may be replaced with a filter and an AC voltage may be output from the second port 102.

Operations of the high-frequency device 210 of Application example 11 as a magnetic sensor and a rectifier are almost the same as those of the high-frequency device 200 of Application example 10. Here, since the high-frequency line 40 is connected to the magnetoresistance effect element 10 and the high-frequency current $I_{R1}$ flowing through the high-frequency line 40 flows through the magnetoresistance effect element 10, the high-frequency current $I_{R2}$ flowing through the magnetoresistance effect element 10 in Application example 10 is replaced with the high-frequency current $I_{R1}$ flowing through the magnetoresistance effect element 10 in Application example 11. Therefore, the phase difference $\Delta\theta_1$ in Application example 10 is replaced with a phase difference $\Delta\theta_2$ between a phase of the high-frequency current $I_{R1}$ and a phase of the resistance $R_{10}$ of the magnetoresistance effect element 10.

Application Example 12

Figure 20:
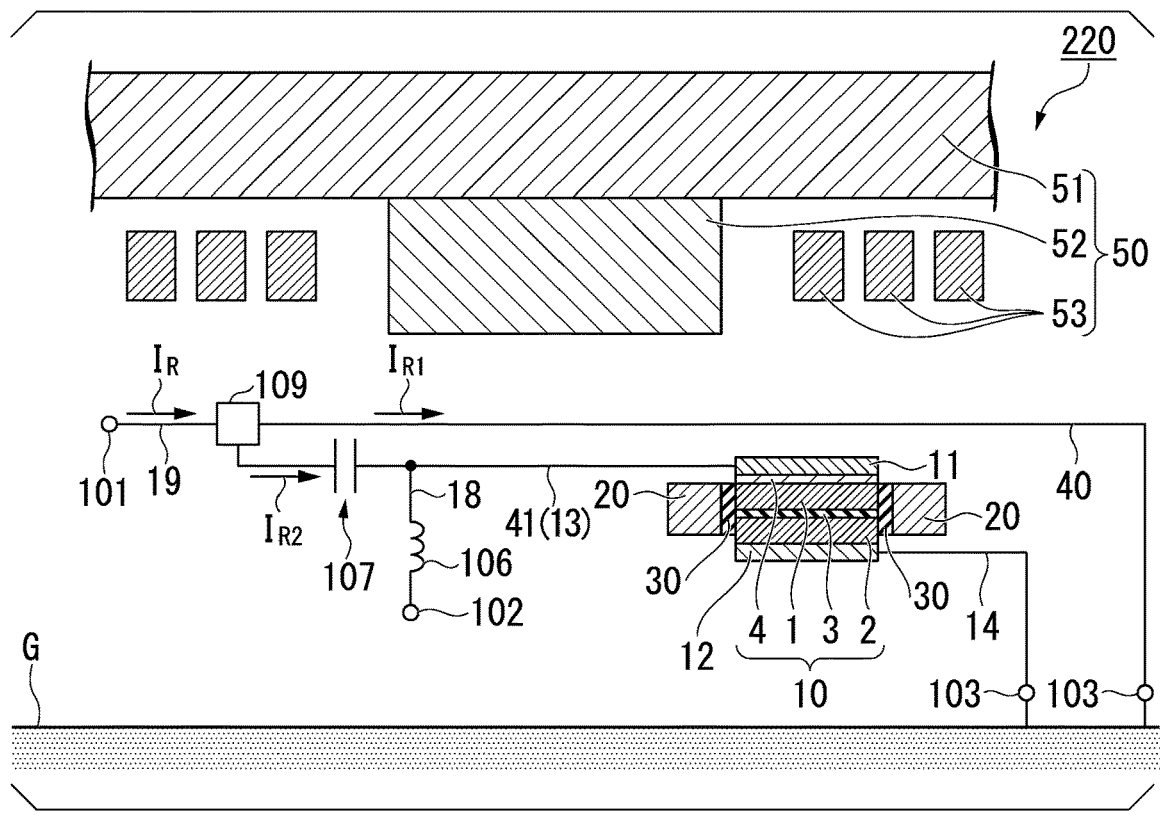
FIG. 20 shows an application example of the high-frequency device of the first embodiment.

FIG. 20 shows another example of the circuit of the high-frequency device to which the high-frequency device of the first embodiment is applied. A high-frequency device 220 shown in FIG. 20 functions as, for example, a sensor, a rectifier, or the like. Constituent elements of FIG. 20 that are the same as those of FIG. 9 will be denoted by the same reference numerals as FIG. 9. In FIG. 20, an opposing portion 54 of a magnetic field application unit 50 is omitted as in FIG. 9.

The high-frequency device 220 shown in FIG. 20 has a high-frequency line 40 and a high-frequency line 41. The high-frequency line 41 also functions as a first line 13. Furthermore, the high-frequency device 220 has a branch portion 109. The high-frequency line 40 shown in FIG. 20 has a first end connected to the branch portion 109 and a second end connected to a reference potential terminal 103. A first line 13 (the high-frequency line 41) shown in FIG. 20 has a first end connected to the branch portion 109 and a second end connected to an upper electrode 11. A line 18 reaching a second port 102 is connected to the first line 13. For example, a capacitor 107 is present in the first line 13 and an inductor 106 is present in the line 18. A second line 14 shown in FIG. 20 has a first end connected to a lower electrode 12 and a second end connected to a reference potential terminal 103. Furthermore, the branch portion 109 is connected to a first port 101 via a line 19.

When a high-frequency signal is input to the first port 101, a high-frequency current $I_R$ flows to the line 19. The high-frequency current $I_R$ branches into the high-frequency line 40 and the first line 13 at the branch portion 109 and a high-frequency current $I_{R1}$ flows to the high-frequency line 40 and a high-frequency current $I_{R2}$ flows to the first line 13. The high-frequency current $I_{R1}$ causes a high-frequency magnetic field $H_{rf}$. The high-frequency magnetic field $H_{rf}$ is applied to the first ferromagnetic layer 1 of the magnetoresistance effect element 10.

The magnetization of the first ferromagnetic layer 1 oscillates by a high-frequency magnetic field caused by the high-frequency current $I_{R1}$. A resistance $R_{10}$ of the magnetoresistance effect element 10 changes (oscillates) when the magnetization of the first ferromagnetic layer 1 oscillates.

The high-frequency current $I_{R2}$ flows through the magnetoresistance effect element 10. For example, a voltage caused by an output from the magnetoresistance effect element 10 is output from the second port 102. When the high-frequency device 220 outputs a DC voltage from the second port 102, the high-frequency device 220 functions as a rectifier. On the other hand, when the high-frequency device 220 is used for applications other than the rectifier, the inductor 106 in the high-frequency device 220 may be replaced with a filter and an AC voltage may be output from the second port 102.

Operations of the high-frequency device 220 of Application example 12 as a sensor and a rectifier are almost the same as the high-frequency device 200 of Application example 10.

Application examples 1 to 12 described above are examples of the high-frequency device of this embodiment but the high-frequency device of this embodiment is not limited to these examples. For example, the characteristic configuration of each application example may be used for other application examples. For example, the magnetic body portion 108 of Application example 5 may be used in Application examples 1, 3, 4, 7, 8, and 10 to 12.

EXAMPLE

In the following examples and comparative examples, passing characteristics of a high-frequency device having the same configuration as in Application example 1 are obtained by simulation. Simulation is performed using LLG simulation.

Examples 1 to 5 and Comparative Example 1

In Examples 1 to 5 and Comparative example 1, simulation is performed by changing a thickness of a soft magnetic material body covering a periphery of a magnetoresistance effect element. In the following description, an element configuration on which simulation is performed will be described in detail.

Example 1

In Example 1, a soft magnetic material body is disposed in the periphery of a magnetoresistance effect element. A magnetoresistance effect element is made of a magnetization-free layer, a spacer layer, and a magnetization-fixed layer. A magnetoresistance effect element is in a form of a cylinder having a diameter of 45 nm. A thickness of a magnetization-free layer is set to 2.0 nm, a thickness of a spacer layer is set to 0.95 nm, and a thickness of a magnetization-fixed layer is set to 1.8 nm. A soft magnetic material body encloses the entire periphery of a magnetoresistance effect element in a concentric shape, and a distance between the periphery of a magnetoresistance effect element and an inner circumference of the soft magnetic material body is set to 2.5 nm. This distance corresponds to a width of a non-magnetic material body. The thickness of the soft magnetic material body is set to 2.0 nm, and an outer diameter of the soft magnetic material body is set to 300 nm. The soft magnetic material body is arranged or provided to cover the periphery of the magnetization-free layer in the lamination direction. Center positions of the magnetization-free layer and the soft magnetic material body in the lamination direction coincide with each other.

The magnetization-free layer is set to an in-plane magnetization film having an axis of easy magnetization in the in-plane direction. A saturation magnetization Ms of the magnetization-free layer in the lamination direction is set to $4\pi Ms=16.5$ kOe, a saturation magnetic field Hs in the lamination direction is set to 4.0 kOe, and a damping constant $\alpha$ is set to 0.02. The saturation magnetization Ms of the soft magnetic material body in the lamination direction is set to $4\pi Ms=7.4$ kOe, the saturation magnetic field Hs in the lamination direction is set to 7.4 kOe, and the damping constant $\alpha$ is set to 0.02.

A high-frequency magnetic field in which a frequency with an amplitude of 2 Oe is combined with a sine wave in a range of 1 GHz to 15 GHz is applied to a magnetization-free layer of a magnetoresistance effect element, and furthermore, a static magnetic field of 2000 Oe is applied to the magnetoresistance effect element and the soft magnetic material body at 60° of an elevation angle (an angle formed between a lamination plane of the magnetoresistance effect element and a static magnetic field).

Figure 21:
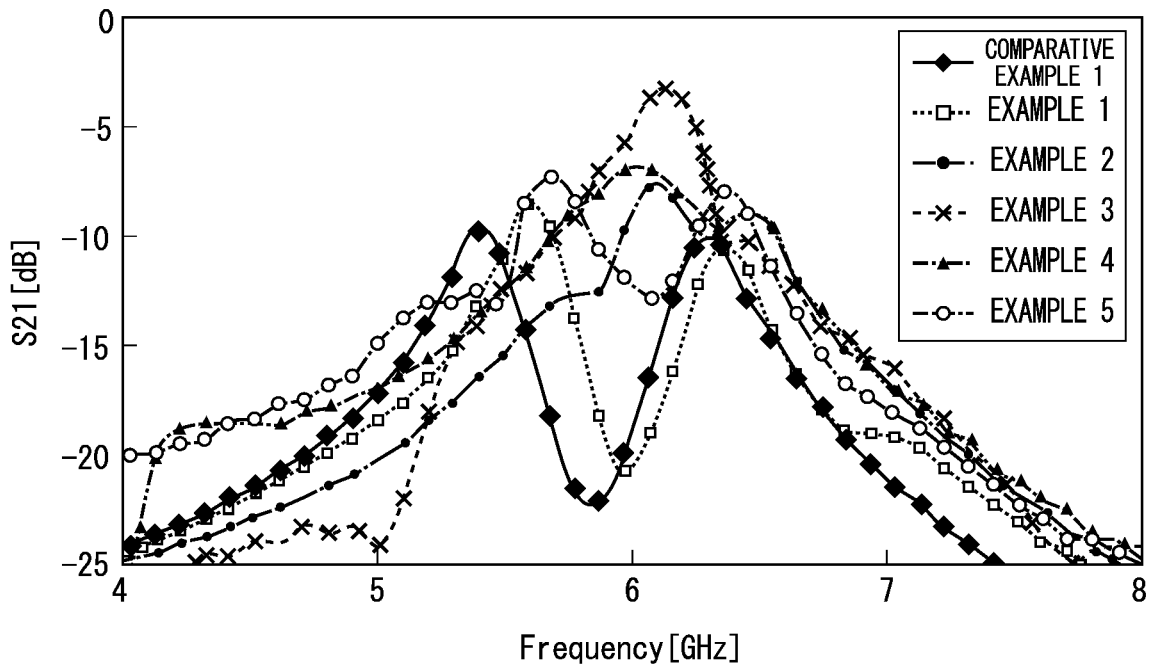
FIG. 21 is a result of passing characteristics of high-frequency devices of Example 1 to Example 5 and Comparative Example 1.

Under the above conditions, the passing characteristics (S21) of a high-frequency device in Example 1 are obtained. The results are shown in FIG. 21. The passing characteristics of a high-frequency device are obtained by dividing power output from the high-frequency device by power input to the high-frequency device. That is, $S21=10\times\log_{10}$ ([power of an output signal]/[power of an input signal]) can be established.

Example 2 to Example 5

Examples 2 to 5 are different from Example 1 only in that the thickness of the soft magnetic material body is changed without changing the center position thereof in the lamination direction. A thickness of the soft magnetic material body is set to 6 nm in Example 2, is set to 10 nm in Example 3, is set to 20 nm in Example 4, and is set to 30 nm in Example 5. The passing characteristics of the high-frequency device in Examples 2 to 5 are obtained. The results are shown in FIG. 21.

Comparative Example 1

Comparative example 1 is different from Example 1 only in that the soft magnetic material body is not provided. The passing characteristics of a high-frequency device of Comparative example 1 are obtained. The results are shown in FIG. 21.

As shown in FIG. 21, the passing characteristics having two peaks are shown, and the ferromagnetic resonance frequency of a magnetization-free layer is non-uniform in Comparative example 1. On the other hand, uniformity of the ferromagnetic resonance frequency of a magnetization-free layer is improved in Examples 1 to 5. In particular, the passing characteristics have one peak and the uniformity of the ferromagnetic resonance frequency of a magnetization-free layer gets better in Example 3.

Example 2, Example 6 to Example 9, Comparative Example 1

Simulation is performed by changing a distance between the periphery of a magnetoresistance effect element and the inner circumference of a soft magnetic material body (a width of a non-magnetic material body) on the basis of Example 2 described above. In Examples 6 to 9, conditions other than the distance between the periphery of a magnetoresistance effect element and the inner circumference of a soft magnetic material body are the same as in Example 2. The distance described above is set to 1.5 nm in Example 6, is set to 3.5 nm in Example 7, is set to 4.5 nm in Example 8, and is set to 10 nm in Example 9.

Figure 22:
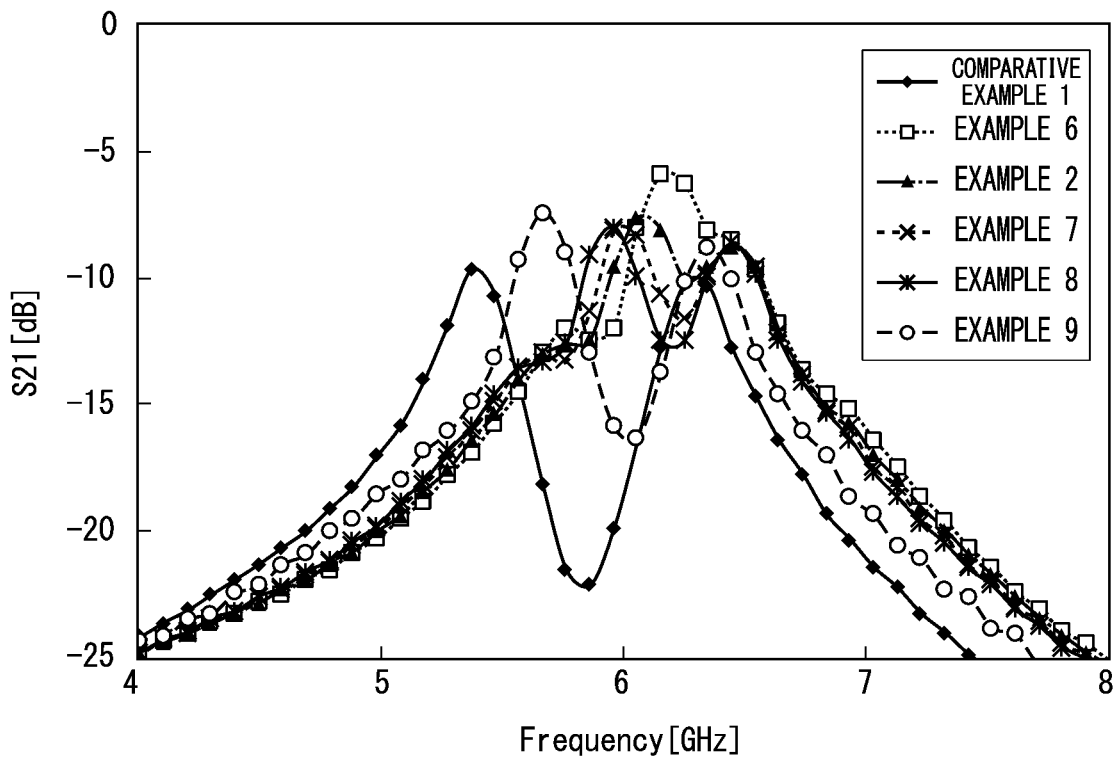
FIG. 22 is a result of passing characteristics of high-frequency devices of Example 2, Example 6 to Example 9, and Comparative Example 1.

FIG. 22 is a simulation result of passing characteristics of the high-frequency devices of Example 2, Example 6 to Example 9, and Comparative example 1. As shown in FIG. 22, if the distance between the periphery of a magnetoresistance effect element and the inner circumference of a soft magnetic material body is changed, a change in the passing characteristics has occurred. As the distance between the periphery of a magnetoresistance effect element and the inner circumference of a soft magnetic material body increases, the uniformity of the ferromagnetic resonance frequency of a magnetization-free layer tends to deteriorate, but since a depth of a valley between peaks of the passing characteristics is shallower and a difference in frequency between the peaks is also smaller in Example 9 than in Example 1, it can be noticed that the uniformity of the ferromagnetic resonance frequency of a magnetization-free layer is improved.

What is claimed is:

1. A high-frequency device, comprising:
a magnetoresistance effect element which includes a first ferromagnetic layer, a second ferromagnetic layer, and a spacer layer positioned between the first ferromagnetic layer and the second ferromagnetic layer;
a soft magnetic material body which covers at least a part of a periphery of the magnetoresistance effect element from outside in a plan view in a lamination direction of the magnetoresistance effect element;
a non-magnetic material body which is positioned between the soft magnetic material body and the first ferromagnetic layer in the plan view in the lamination direction; and
a high-frequency line which is connected to or spaced apart from the magnetoresistance effect element,
wherein the high-frequency line is configured to input or output a high-frequency current to or from the magnetoresistance effect element; or is configured to apply a high-frequency magnetic field caused by a high-frequency current flowing through an inside of the high-frequency line to the magnetoresistance effect element.

2. The high-frequency device according to claim 1, wherein the soft magnetic material body encloses an entire periphery of the magnetoresistance effect element in the plan view in the lamination direction.

3. The high-frequency device according to claim 1, wherein, in the plan view in the lamination direction, the soft magnetic material body covers a part of the periphery of the magnetoresistance effect element from outside,
at least one gap at which the magnetoresistance effect element is free of a coverage by the soft magnetic material body is formed, and
a width of the gap is smaller than a width of the magnetoresistance effect element in a direction parallel to a width direction of the gap.

4. The high-frequency device according to claim 1, wherein at least a portion of a periphery of the first ferromagnetic layer in the lamination direction overlaps with the soft magnetic material body when viewed in a direction perpendicular to the lamination direction.

5. The high-frequency device according to claim 1, wherein a thickness of the soft magnetic material body is thicker than that of the first ferromagnetic layer.

6. The high-frequency device according to claim 5, wherein, the high-frequency device has a portion in which the soft magnetic material body overlaps with an entire portion in the lamination direction of a periphery of the first ferromagnetic layer when viewed from the direction perpendicular to the lamination direction.

7. The high-frequency device according to claim 1, further comprising a magnetic field application unit which is provided at a position for an external magnetic field to be capable of being applied to the first ferromagnetic layer and the soft magnetic material body.

8. The high-frequency device according to claim 1, wherein, in the plan view in the lamination direction, a width of the non-magnetic material body is 1 nm or more and 10 nm or less.

9. The high-frequency device according to claim 1,
wherein the first ferromagnetic layer has an axis of easy magnetization in an in-plane direction, and
a saturation magnetic field of the soft magnetic material body in the lamination direction is larger than a saturation magnetic field of the first ferromagnetic layer in the lamination direction.

10. The high-frequency device according to claim 1,
wherein the first ferromagnetic layer has an axis of easy magnetization in the lamination direction, and
a saturation magnetic field of the soft magnetic material body in the lamination direction is smaller than a saturation magnetic field of the first ferromagnetic layer in the lamination direction.

11. The high-frequency device according to claim 1,
wherein the soft magnetic material body has a NiFe alloy as a main component, and
the first ferromagnetic layer has a CoFeB alloy as a main component.

* * * * *